United States Patent
Kimura et al.

(10) Patent No.: US 12,531,542 B2
(45) Date of Patent: Jan. 20, 2026

(54) ACOUSTIC WAVE DEVICE

(71) Applicant: Murata Manufacturing Co., Ltd., Nagaokakyo (JP)

(72) Inventors: Tetsuya Kimura, Nagaokakyo (JP); Hisashi Yamazaki, Nagaokakyo (JP); Katsumi Suzuki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 168 days.

(21) Appl. No.: 18/370,689

(22) Filed: Sep. 20, 2023

(65) Prior Publication Data

US 2024/0014802 A1 Jan. 11, 2024

Related U.S. Application Data

(63) Continuation of application No. PCT/JP2022/014500, filed on Mar. 25, 2022.
(Continued)

(51) Int. Cl.
*H03H 9/205* (2006.01)
*H03H 9/02* (2006.01)
(Continued)

(52) U.S. Cl.
CPC ........ *H03H 9/205* (2013.01); *H03H 9/02007* (2013.01); *H03H 9/02015* (2013.01);
(Continued)

(58) Field of Classification Search
CPC ...... H03H 9/205; H03H 9/02007; H03H 9/13; H03H 9/587; H03H 9/64
(Continued)

(56) References Cited

U.S. PATENT DOCUMENTS

| 2005/0140247 A1* | 6/2005 | Lee ............ H03H 9/02149 310/320 |
|---|---|---|
| 2010/0019866 A1 | 1/2010 | Hara et al. |

(Continued)

FOREIGN PATENT DOCUMENTS

| JP | 2006229611 A | 8/2006 |
|---|---|---|
| JP | 2010028679 A | 2/2010 |

(Continued)

OTHER PUBLICATIONS

International Search Report in PCT/JP2022/014500, mailed Jun. 7, 2022, 4 pages.
Written Opinion in PCT/JP2022/014500, mailed Jun. 7, 2022, 6 pages.

*Primary Examiner* — Rakesh B Patel
(74) *Attorney, Agent, or Firm* — Keating & Bennett, LLP

(57) ABSTRACT

An acoustic wave device includes a support including a support substrate with a thickness direction in a first direction, a piezoelectric layer on the support, and resonators each including a functional electrode provided to the piezoelectric layer. The support is provided with a hollow portion at a position overlapping at least a portion of each of the resonators in plan view in the first direction. The resonators include a first resonator and a second resonator adjacent to each other. A through hole reaching the hollow portion is provided to the piezoelectric layer between the first resonator and the second resonator.

27 Claims, 16 Drawing Sheets

Related U.S. Application Data

(60) Provisional application No. 63/168,329, filed on Mar. 31, 2021, provisional application No. 63/168,297, filed on Mar. 31, 2021.

(51) Int. Cl.
| | | |
|---|---|---|
| *H03H 9/13* | (2006.01) | |
| *H03H 9/58* | (2006.01) | |
| *H03H 9/64* | (2006.01) | |

(52) U.S. Cl.
CPC .......... *H03H 9/02228* (2013.01); *H03H 9/13* (2013.01); *H03H 9/587* (2013.01); *H03H 9/64* (2013.01)

(58) Field of Classification Search
USPC .................................................. 333/186–193
See application file for complete search history.

(56) References Cited

U.S. PATENT DOCUMENTS

| | | |
|---|---|---|
| 2010/0223999 A1 | 9/2010 | Onoe |
| 2013/0057360 A1 | 3/2013 | Meltaus et al. |
| 2014/0152145 A1 | 6/2014 | Kando et al. |
| 2020/0028487 A1* | 1/2020 | Caron ................ H03H 9/02228 |

FOREIGN PATENT DOCUMENTS

| | | |
|---|---|---|
| JP | 2010147871 A | 7/2010 |
| JP | 2010233210 A | 10/2010 |
| JP | 2013528996 A | 7/2013 |
| JP | 2019009671 A | 1/2019 |
| JP | 2021027397 A | 2/2021 |
| WO | 2012073871 A1 | 6/2012 |
| WO | 2016147687 A1 | 9/2016 |

* cited by examiner

ACOUSTIC WAVE DEVICE

CROSS REFERENCE TO RELATED APPLICATIONS

This application claims the benefit of priority to Provisional Application Nos. 63/168,297 and 63/168,329 filed on Mar. 31, 2021, and is a Continuation Application of PCT Application No. PCT/JP2022/014500 filed on Mar. 25, 2022. The entire contents of each application are hereby incorporated herein by reference.

BACKGROUND OF THE INVENTION

1. Field of the Invention

The present disclosure relates to an acoustic wave device including a piezoelectric layer.

2. Description of the Related Art

For example, International Publication No. 2016/147687 discloses an acoustic wave device that includes a support substrate, a thin film, a piezoelectric substrate, and an IDT electrode. An upper surface of the support substrate is provided with a recess. The thin film is disposed on the support substrate. The piezoelectric substrate includes a first principal surface and a second principal surface opposed to the first principal surface, and the first principal surface side is disposed on the thin film. The IDT electrode is provided on the second principal surface of the piezoelectric substrate. A hollow surrounded by the support substrate and at least the thin film out of the thin film and the piezoelectric substrate is formed. The thin film is provided in a region on the first principal surface of the piezoelectric substrate, which is a region joined to the support substrate with the thin film interposed therebetween, and in a region of at least a portion of a region above the hollow.

SUMMARY OF THE INVENTION

In recent years, there has been a demand for an acoustic wave device which is capable of reducing or preventing deterioration of characteristics.

Preferred embodiments of the present invention provide acoustic wave devices each capable of reducing or preventing deterioration of characteristics.

An acoustic wave device according to an aspect of a preferred embodiment of the present invention includes a support including a support substrate with a thickness direction in a first direction, a piezoelectric layer provided on the support, and a plurality of resonators each including a functional electrode provided to the piezoelectric layer. The support is provided with a hollow portion at a position overlapping at least a portion of each of the plurality of resonators in plan view in the first direction. The plurality of resonators include a first resonator and a second resonator adjacent to each other. A through hole reaching the hollow portion is provided to the piezoelectric layer between the first resonator and the second resonator.

According to preferred embodiments of the present disclosure, it is possible to provide acoustic wave devices each capable of reducing or preventing deterioration of characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Each of acoustic wave devices according to first, second, and third aspects of preferred embodiments of the present invention includes a piezoelectric layer made of lithium niobate or lithium tantalate, and a first electrode and a second electrode which are opposed to each other in a direction intersecting with a thickness direction of the piezoelectric layer.

A bulk wave in a thickness-shear primary mode is used in the acoustic wave device of the first aspect.

Meanwhile, in the acoustic wave device of the second aspect of a preferred embodiment of the present invention, the first electrode and the second electrode are electrodes that are adjacent to each other. When a thickness of the piezoelectric layer is defined as d and a center-to-center distance between the first electrode and the second electrode is defined as p, d/p is set to less than or equal to about 0.5, for example. Accordingly, in the first and second aspects, it is possible to increase a Q factor even when downsizing is conducted.

Meanwhile, the acoustic wave device of the third aspect of a preferred embodiment of the present invention uses a Lamb wave as a plate wave. Moreover, it is possible to obtain resonance characteristics attributed to the above-mentioned Lamb wave.

An acoustic wave device of a fourth aspect of a preferred embodiment of the present invention includes a piezoelectric layer made of lithium niobate or lithium tantalate, and an upper electrode and a lower electrode which are opposed to each other in a thickness direction of the piezoelectric layer with the piezoelectric layer interposed therebetween. The acoustic wave device uses a bulk wave.

The present disclosure will be clarified below by explaining specific preferred embodiments of the acoustic wave devices of the first to fourth aspects with reference to the drawings.

Note that the preferred embodiments described in the present specification are merely exemplary, and it is pointed out that partial replacement or combination of configurations across different preferred embodiments are possible.

First Preferred Embodiment

Figure 1A:
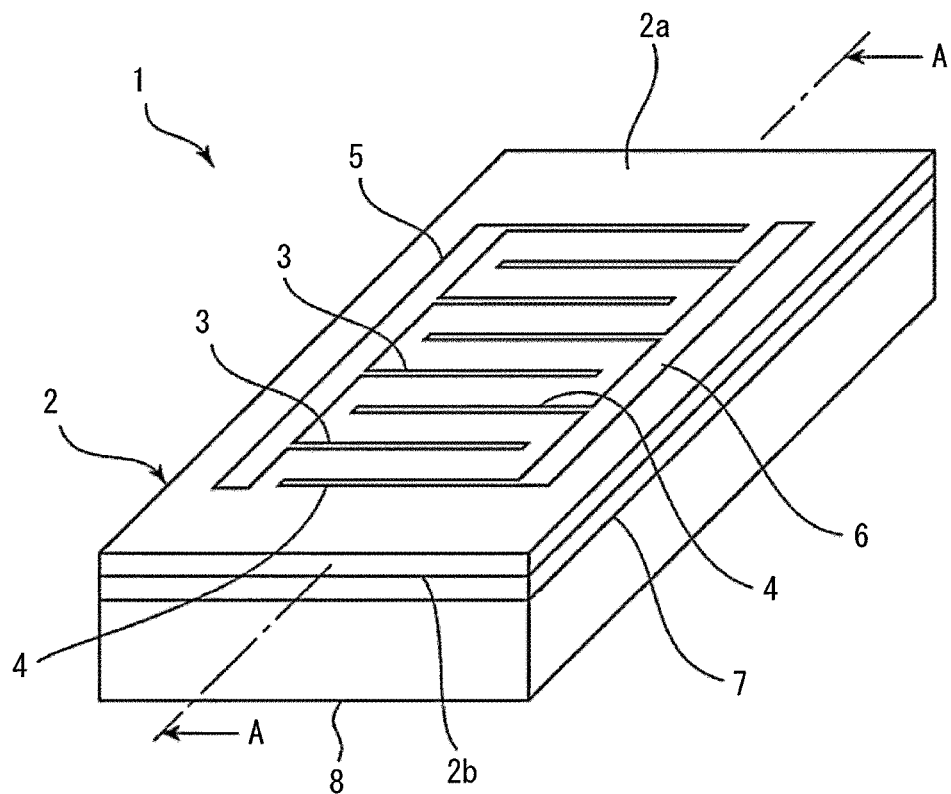
FIG. 1A is a schematic perspective view showing the appearance of an acoustic wave device according to first and second aspects of preferred embodiments of the present invention.
Figure 1B:
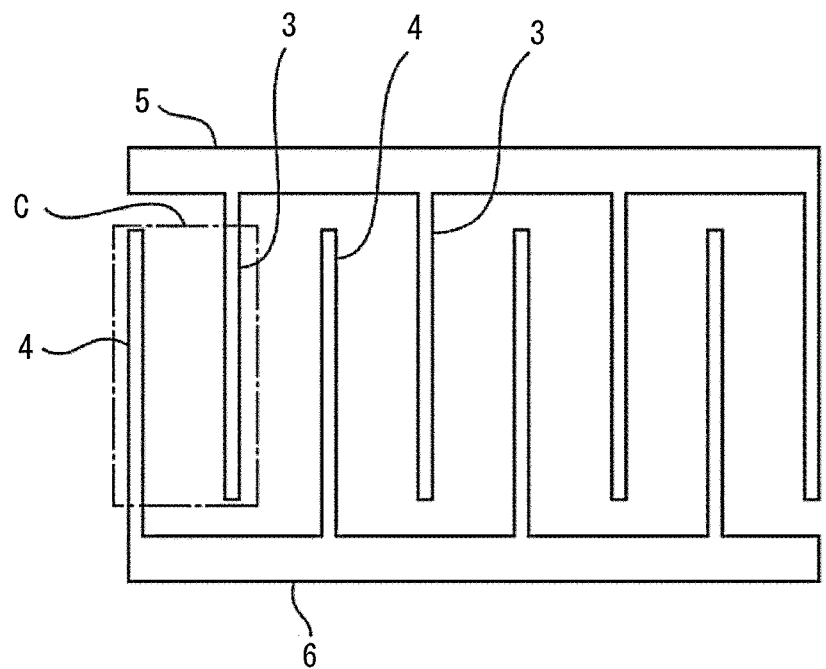
FIG. 1B is a plan view showing an electrode structure on a piezoelectric layer.
Figure 2:
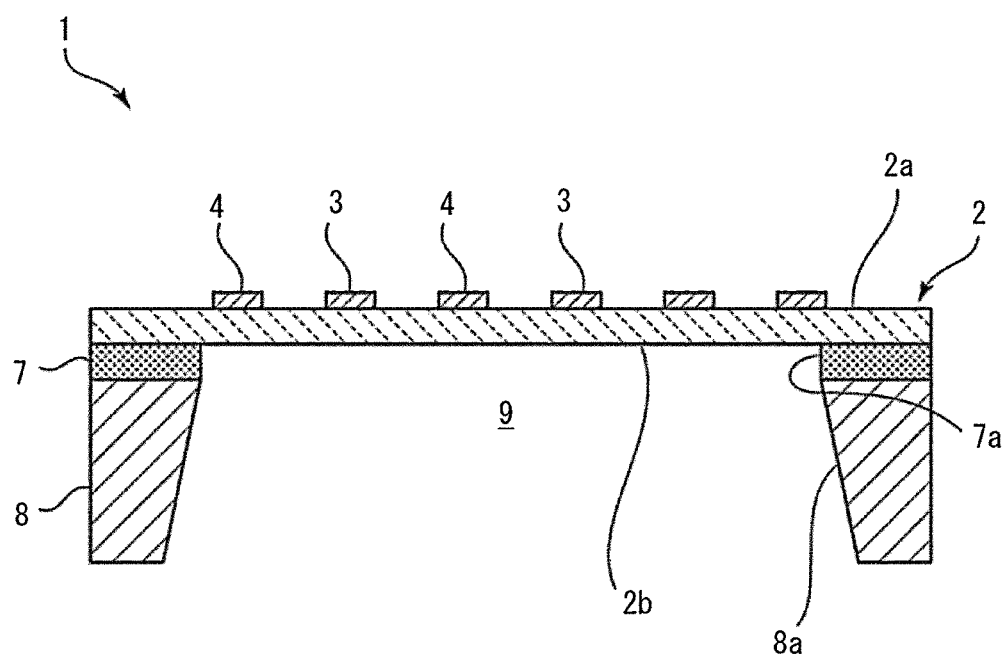
FIG. 2 is a cross-sectional view of a portion along line A-A in FIG. 1A.

FIG. 1A is a schematic perspective view showing the appearance of an acoustic wave device according to a first preferred embodiment concerning the first and second aspects. FIG. 1B is a plan view showing an electrode structure on a piezoelectric layer. FIG. 2 is a cross-sectional view of a portion along line A-A in FIG. 1A.

An acoustic wave device 1 includes a piezoelectric layer 2 made of $LiNbO_3$. The piezoelectric layer 2 may be made of $LiTaO_3$ instead. Cut-angles of $LiNbO_3$ and $LiTaO_3$ are of Z-cut in the present preferred embodiment. Instead, the cut-angles may be of rotated Y-cut or X-cut. Preferably, the cut-angles have a propagation orientation of Y-propagation and X-propagation±about 30°, for example. Although a thickness of the piezoelectric layer 2 is not limited to a particular thickness, the thickness is preferably greater than or equal to about 50 nm and less than or equal to about 1000 nm, for example, in order to effectively excite a thickness-shear primary mode.

The piezoelectric layer 2 includes first and second principal surfaces 2a and 2b that are opposed to each other. Electrodes 3 and electrodes 4 are provided on the first principal surface 2a. Here, the electrodes 3 are an example of "first electrode", and the electrodes 4 are an example of "second electrode". In FIGS. 1A and 1B, the electrodes 3 are first electrode fingers connected to a first busbar 5, and the electrodes 4 are second electrode fingers connected to a second busbar 6. The electrodes 3 and the electrodes 4 are interdigitated with one another.

Each of the electrodes 3 and the electrodes 4 has a rectangular shape and has a longitudinal direction. An electrode 3 is opposed to an adjacent electrode 4 in a direction orthogonal to this longitudinal direction. An interdigital transducer (IDT) electrode is formed by these electrodes 3 and 4, the first busbar 5, and the second busbar 6. Both the longitudinal direction of the electrodes 3 and 4 and the direction orthogonal to the longitudinal direction of the electrodes 3 and 4 are directions intersecting with a thickness direction of the piezoelectric layer 2. Accordingly, it is also possible to say that the electrode 3 is opposed to the adjacent electrode 4 in a direction intersecting with the thickness direction of the piezoelectric layer 2.

Alternatively, the longitudinal direction of the electrodes 3 and 4 may be interchanged with a direction orthogonal to the longitudinal direction of the electrodes 3 and 4 shown in FIGS. 1A and 1B. Specifically, in FIGS. 1A and 1B, the electrodes 3 and 4 may extend in a direction in which the first busbar 5 and the second busbar 6 extend. In this case, the first busbar 5 and the second busbar 6 extend in the direction in which the electrodes 3 and 4 extend in FIGS. 1A and 1B.

Moreover, structures each including a pair of an electrode 3 connected to one potential and an electrode 4 connected to another potential being adjacent to each other are provided in the direction orthogonal to the longitudinal direction of the electrodes 3 and 4 described above. Here, the state of the electrode 3 and the electrode 4 being adjacent to each other does not mean a case where the electrode 3 and the electrode 4 are disposed in direct contact but means a case where the electrode 3 and the electrode 4 are disposed with a clearance interposed therebetween.

Meanwhile, in the case where an electrode 3 and an electrode 4 are adjacent to each other, electrodes inclusive of other electrodes 3 and 4 to be connected to hot electrodes or ground electrodes are not disposed between the relevant electrodes 3 and 4. The number of pairs does not necessarily have to represent an integral number of pairs but may represent 1.5 pairs, 2.5 pairs, and the like. A center-to-center distance, namely, a pitch between the electrodes 3 and 4 is preferably in a range of greater than or equal to 1 μm and less than or equal to 10 μm. Meanwhile, the center-to-center distance between the electrodes 3 and 4 is equivalent to a distance from the center of a width dimension of the electrode 3 in the direction orthogonal to the longitudinal direction of the electrode 3 to the center of a width dimension of the electrode 4 in the direction orthogonal to the longitudinal direction of the electrode 4. In addition, in a case where there are two or more electrodes 3 and/or two or more electrodes 4 (in a case where there are 1.5 pairs or more of electrodes assuming that each pair of electrodes includes an electrode 3 and an electrode 4), the center-to-center distance of the electrodes 3 and 4 represents an average value of the respective center-to-center distances of the electrodes 3 and 4 being adjacent to each other out of the 1.5 pairs or more of the electrodes 3 and 4. Meanwhile, a width of the electrodes 3 and 4, that is, a dimension in a direction in which the electrodes 3 and 4 are opposed to each other is preferably in a range of greater than or equal to about 150 nm and less than or equal to about 1000 nm, for example. Here, the center-to-center distance between the electrodes 3 and 4 is equivalent to the distance from the center of the dimension (the width dimension) of the electrode 3 in the direction orthogonal to the longitudinal direction of the electrode 3 to the center of the dimension (the width dimension) of the electrode 4 in the direction orthogonal to the longitudinal direction of the electrode 4.

Meanwhile, since the Z-cut piezoelectric layer is used in the present preferred embodiment, the direction orthogonal to the longitudinal direction of the electrodes 3 and 4 is equivalent to a direction orthogonal to a direction of polarization of the piezoelectric layer 2. This is not true of a case where a piezoelectric body of a different cut-angle is used as the piezoelectric layer 2. Here, the term "orthogonal" is not limited only to a case of being strictly orthogonal but also includes a case of being substantially orthogonal (where an angle defined between the direction orthogonal to the longitudinal direction of the electrodes 3 and 4 and the direction of polarization may be about 90°±10°, for example).

A support member 8 is disposed on the second principal surface 2b side of the piezoelectric layer 2 with an insulating layer 7 interposed therebetween. The insulating layer 7 and the support member 8 each have a frame-like shape and are provided with cavities 7a and 8a as shown in FIG. 2, thereby forming a hollow portion 9. The hollow portion 9 is provided in order not to disturb vibration of an excitation region C of the piezoelectric layer 2. Accordingly, the above-described support member 8 is disposed on the second principal surface 2b with the insulating layer 7 interposed therebetween at a position not overlapping at least a portion provided with a pair of the electrodes 3 and 4. Here, the insulating layer 7 does not necessarily have to be provided. Accordingly, the support member 8 may be disposed either directly or indirectly on the second principal surface 2b of the piezoelectric layer 2.

The insulating layer 7 is made of silicon oxide. Nonetheless, it is possible to use an appropriate insulating material such as silicon oxynitride or alumina besides silicon oxide. The support member 8 is made of Si. A plane orientation of a surface on the piezoelectric layer 2 side of Si may be of (100), (110), or (111). Preferably, high-resistivity Si having a resistivity greater than or equal to about 4 kΩ, for example, is desired. Nonetheless, the support member 8 can also be formed by using an appropriate insulating material or an appropriate semiconductor material as well. For example, any of piezoelectric bodies such as aluminum oxide, lithium tantalate, lithium niobate, and quartz, various ceramics such as alumina, magnesia, sapphire, silicon nitride, aluminum nitride, silicon carbide, zirconia, cordierite, mullite, steatite, and forsterite, dielectrics such as diamond and glass, semiconductors such as gallium nitride can be used as the material of the support member 8.

The above-mentioned electrodes 3 and 4 and the first and second busbars 5 and 6 are made of an appropriate metal or alloy such as Al or AlCu alloy. In the present preferred embodiment, the electrodes 3 and 4 and the first and second busbars 5 and 6 have a structure obtained by forming an Al film on a Ti film. Here, a close contact layer other than the Ti film may be used instead.

An alternating-current voltage is applied between the electrodes 3 and the electrodes 4 for driving. To be more precise, the alternating-current voltage is applied between the first busbar 5 and the second busbar 6. Thus, it is possible to obtain resonance characteristics by using the bulk wave in the thickness-shear primary mode excited in the piezoelectric layer 2.

Meanwhile, in the acoustic wave device 1, d/p is set to less than or equal to about 0.5, for example, when the thickness of the piezoelectric layer 2 is defined as d and the center-to-center distance of certain electrodes 3 and 4 being adjacent to each other out of the multiple pairs of the electrodes 3 and 4 is defined as p. Accordingly, the above-mentioned bulk wave in the thickness-shear primary mode is effectively excited so that good resonance characteristics can be obtained. More preferably, d/p is less than or equal to about 0.24, for example. In this case, it is possible to obtain even better resonance characteristics.

Here, in the case where there are two or more electrodes 3 and/or two or more electrodes 4 as in the present preferred embodiment, or more specifically, in the case where there are 1.5 pairs or more of the electrodes 3 and 4 assuming that each pair of electrodes includes one electrode 3 and one electrode 4, a center-to-center distance p of the electrodes 3 and 4 being adjacent to each other represents the average value of the respective center-to-center distances of the electrodes 3 and 4 being adjacent to each other.

Since the acoustic wave device 1 of the present preferred embodiment includes the above-described configuration, a decrease in Q factor is less likely to occur even when the number of pairs of the electrodes 3 and 4 is reduced in an attempt to downsize. This is attributed to a resonator which does not require reflectors on both sides and causes a small propagation loss. Another reason for not requiring the reflectors is attributed to the use of the bulk wave in the thickness-shear primary mode.

A difference between the Lamb wave used in the acoustic wave device of the related art and the bulk wave in the above-described thickness-shear primary mode will be described with reference to FIGS. 3A and 3B.

Figure 3A:
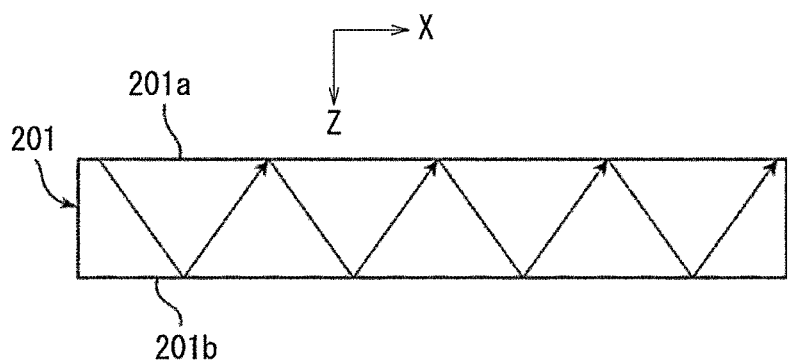
FIG. 3A is a schematic elevational cross-sectional view for explaining a Lamb wave that propagates in a piezoelectric film of an acoustic wave device of the related art.

FIG. 3A is a schematic elevational cross-sectional view for explaining the Lamb wave that propagates in the piezoelectric film of the acoustic wave device of the related art. The acoustic wave device of the related art is disclosed in Japanese Unexamined Patent Application Publication No. 2012-257019, for example. As shown in FIG. 3A, in the acoustic wave device of the related art, a wave propagates as indicated with an arrow in a piezoelectric film 201. Here, in the piezoelectric film 201, a first principal surface 201a and a second principal surface 201b are opposed to each other, and a thickness direction from the first principal surface 201a to the second principal surface 201b is equivalent to the Z direction. The X direction is a direction in which electrode fingers of an IDT electrode are arranged. As shown in FIG. 3A, in the Lamb wave, the wave propagates in the X direction as illustrated therein. Being the plate wave, the piezoelectric film 201 vibrates as a whole whereas the wave propagates in the X direction. Accordingly, resonance characteristics are obtained by disposing reflectors on both sides. For this reason, a propagation loss of the wave occurs and the Q factor is therefore deceased in an attempt to downsize, that is, in a case of reducing the number of pairs of the electrode fingers.

Figure 3B:
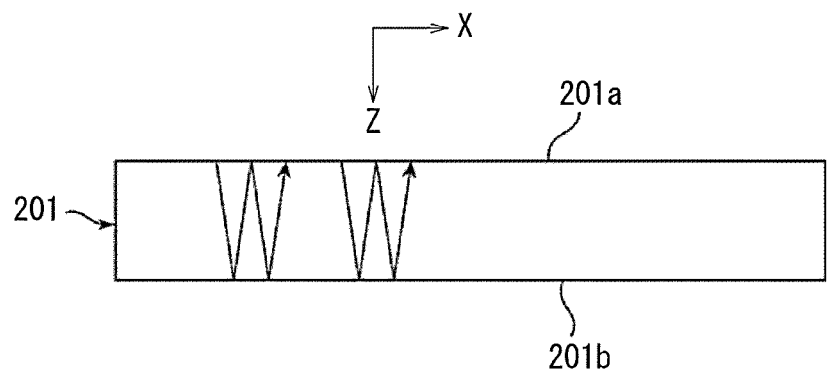
FIG. 3B is a schematic elevational cross-sectional view for explaining a wave in an acoustic wave device according to a preferred embodiment of the present invention.

In contrast, vibration displacement occurs in a thickness-shear direction in the acoustic wave device 1 of the present preferred embodiment, and the wave substantially propagates and resonates in a direction from the first principal surface 2a to the second principal surface 2b of the piezoelectric layer 2, that is to say, in the Z direction as shown in FIG. 3B. In other words, a component in the X direction of the wave is considerably smaller than a component in the Z direction thereof. Moreover, the resonance characteristics are obtained from this propagation of the wave in the Z direction and no reflectors are therefore necessary. Hence, no propagation loss occurs in association with propagation to the reflectors. As a consequence, the Q factor is hardly decreased even in an attempt to reduce the number of pairs of the electrodes formed from the electrodes 3 and 4 in an attempt to conduct downsizing.

Figure 4:
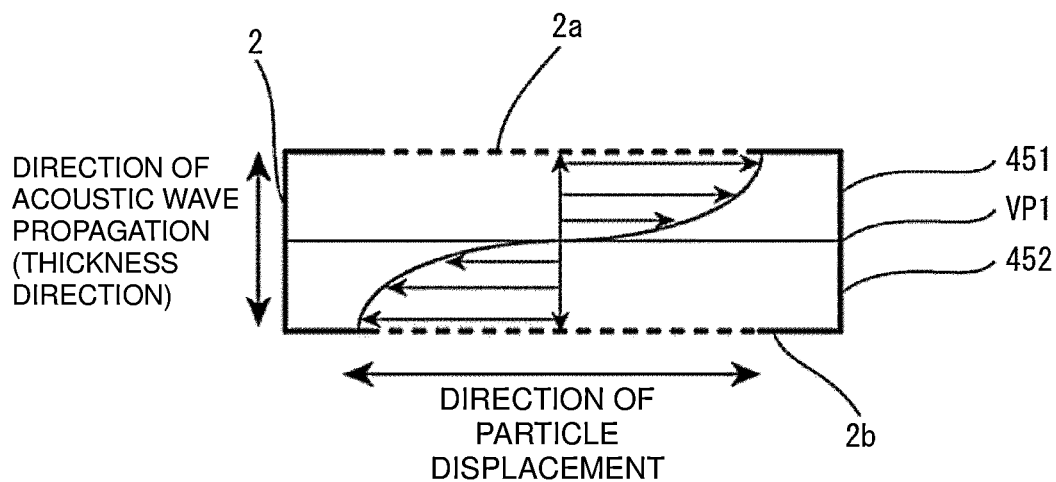
FIG. 4 is a schematic diagram showing a bulk wave in a case where a voltage which renders a voltage at a second electrode higher than that at a first electrode is applied between the first electrode and the second electrode.

Here, a direction of amplitude of the bulk wave in the thickness-shear primary mode in a first region 451 included in the excitation region C of the piezoelectric layer 2 is inverted from that in a second region 452 included in the excitation region C as shown in FIG. 4. FIG. 4 schematically shows the bulk wave in a case where a voltage is applied between the electrodes 3 and the electrodes 4 such that the potential at the electrodes 4 is higher than that at the electrodes 3. The first region 451 is a region within the excitation region C which is located between a virtual plane VP1 that extends orthogonally to the thickness direction of the piezoelectric layer 2 while bisecting the piezoelectric layer 2 and the first principal surface 2a. The second region 452 is a region within the excitation region C which is located between the virtual plane VP1 and the second principal surface 2b.

As described above, at least one pair of electrodes including the electrodes 3 and 4 is disposed at the acoustic wave device 1. However, the number of pairs of electrode pairs including the electrodes 3 and 4 does not necessarily have to be more than one pair because the electrodes are not designed to cause the wave to propagate in the X direction. In other words, provision of at least one pair of electrodes is sufficient.

For example, the electrodes 3 mentioned above are electrodes to be connected to the hot potential and the electrodes 4 are electrodes to be connected to the ground potential. Nonetheless, the electrodes 3 may be connected to the ground potential while the electrodes 4 may be connected to the hot potential. In the present preferred embodiment, as described above, at least one pair of electrodes includes an electrode to be connected to the hot potential or an electrode to be connected to the ground potential, and no floating electrodes are provided therein.

Figure 5:
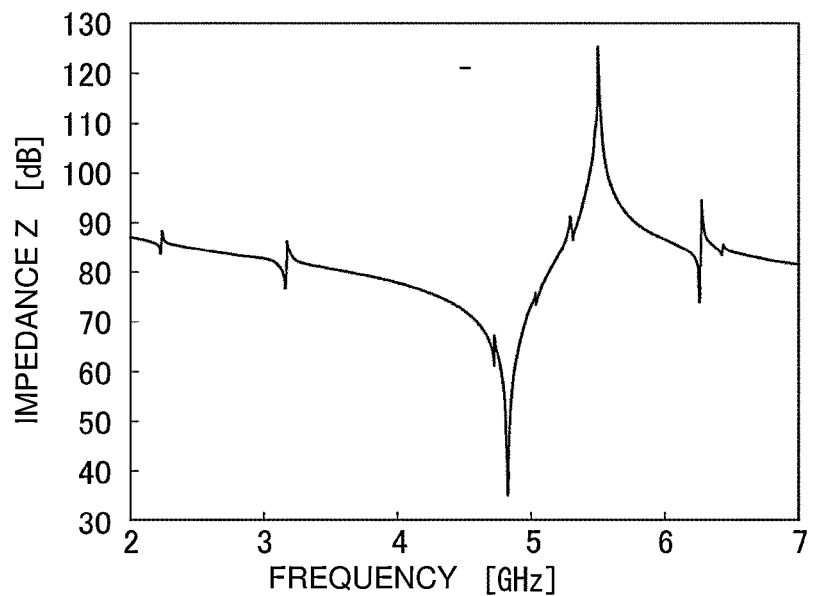
FIG. 5 is a graph showing resonance characteristics of an acoustic wave device according to a first preferred embodiment of the present invention.

FIG. 5 is a graph showing resonance characteristics of the acoustic wave device according to the first preferred embodiment of the present disclosure. Here, design parameters of the acoustic wave device 1 having obtained these resonance characteristics are as follows:

piezoelectric layer 2: LiNbO$_3$ having the Euler angles (0°, 0°, 90°), thickness=about 400 nm; when viewed in the direction orthogonal to the longitudinal direction of the electrodes 3 and 4, the length of the region where the electrodes 3 and 4 overlap, that is, the excitation region C=about 40 μm, the number of pairs of electrodes including the electrodes 3 and 4=21 pairs, a distance between the centers of the electrodes=about 3 μm, the width of the electrodes 3 and 4=about 500 nm, and d/p=about 0.133;

insulating layer 7: a silicon oxide film having a thickness of about 1 μm; and support member 8: Si.

Here, the length of the excitation region C is a dimension of the excitation region C in the longitudinal direction of the electrodes 3 and 4.

In the present preferred embodiment, distances between the electrodes of the electrode pairs including the electrodes 3 and 4 are set to be equal for all the pairs. Specifically, the electrodes 3 and the electrodes 4 are disposed at equal pitches.

As is clear from FIG. 5, good resonance characteristics with the fractional bandwidth of about 12.5%, for example, are obtained in spite of not being provided with the reflectors.

Meanwhile, in the case where d is the thickness of the above-described piezoelectric layer 2 and p is the center-to-center distance of electrodes between the electrodes 3 and 4, d/p is less than or equal to about 0.5 or preferably less than or equal to about 0.24, for example, in the present preferred embodiment. This will be described with reference to FIG. 6.

Figure 6:
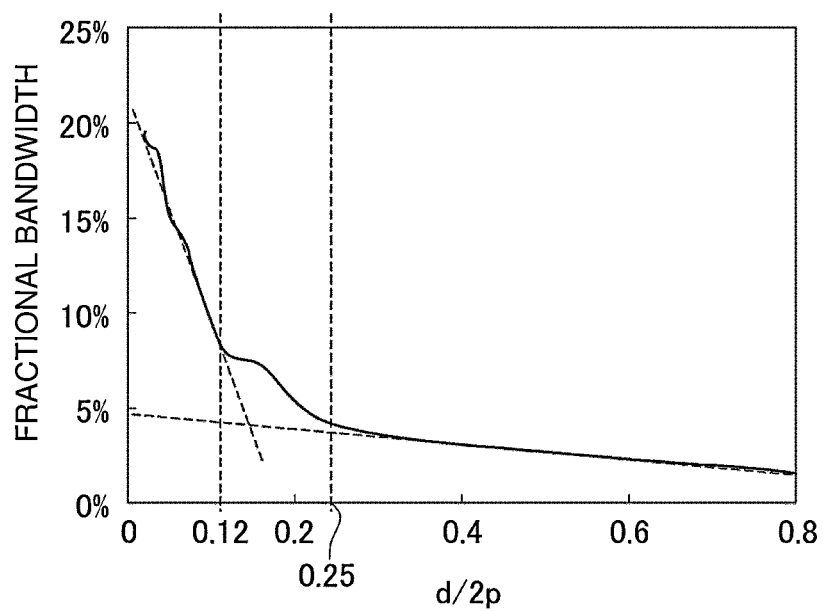
FIG. 6 is a graph showing a relation between d/2p and a fractional bandwidth as a resonator of the acoustic wave device.

As with the acoustic wave device having obtained the resonance characteristics shown in FIG. 5, acoustic wave devices are obtained while changing d/2p. FIG. 6 is a graph showing a relation between d/2p and the fractional bandwidth as a resonator of each of the acoustic wave devices.

As is clear from FIG. 6, when d/2p exceeds about 0.25, that is, when d/p>about 0.5, for example, the fractional bandwidth falls below about 5% even when d/p is adjusted. On the other hand, when d/2p≤about 0.25, that is, when d/p≤about 0.5, the fractional bandwidth can be set to greater than or equal to about 5% by changing d/p within this range, for example. In other words, it is possible to configure the resonator having a high coupling coefficient. Meanwhile, when d/2p is less than or equal to about 0.12, that is, when d/p is less than or equal to about 0.24, it is possible to increase the fractional bandwidth to greater than or equal to about 7%, for example. In addition, by adjusting d/p within this range, it is possible to obtain the resonator having an even wider fractional bandwidth, so that the resonator having a higher coupling coefficient can be realized. Accordingly, it turns out that the resonator having the high coupling coefficient by using the bulk wave in the above-described thickness-shear primary mode can be configured by setting d/p to less than or equal to about 0.5, for example, as in the acoustic wave device of the second aspect of a preferred embodiment of the present invention.

Here, as described above, at least one pair of electrodes may include one pair. In the case of such one pair of electrodes, p described above is defined as the center-to-center distance between the electrodes 3 and 4 being adjacent to each other. Meanwhile, in the case of 1.5 pairs or more of electrodes, the average distance of the center-to-center distances of the electrodes 3 and 4 adjacent to each other may be defined as p.

Meanwhile, regarding the thickness d of the piezoelectric layer as well, an averaged value of thickness may be adopted in the case where the piezoelectric layer 2 has a variation in thickness.

Figure 7:
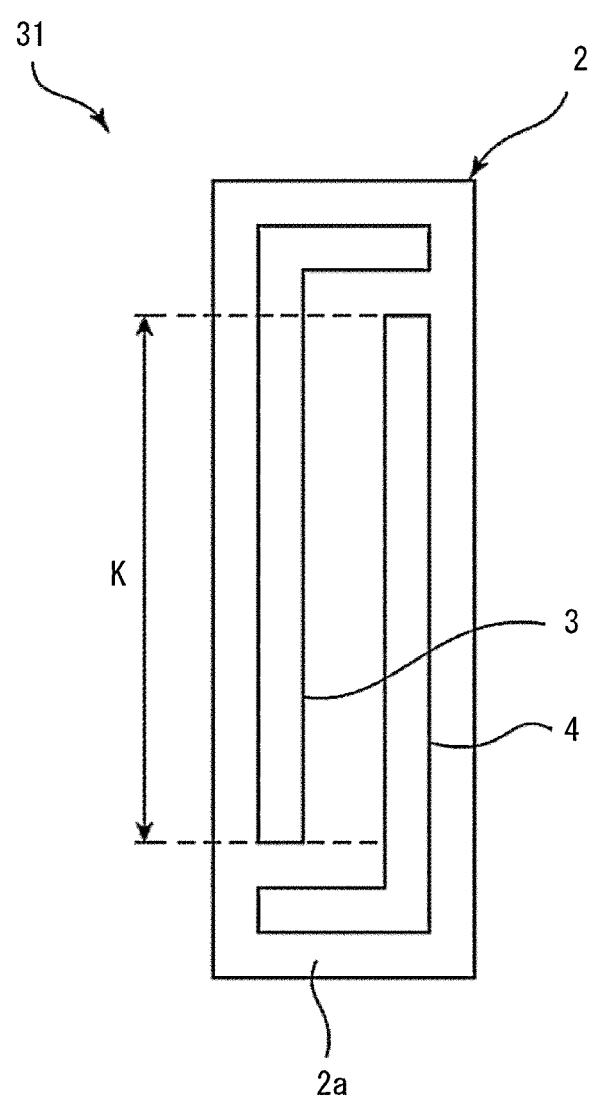
FIG. 7 is a plan view of another acoustic wave device according to the first preferred embodiment of the present invention.

FIG. 7 is a plan view of another acoustic wave device according to the first preferred embodiment of the present disclosure. In an acoustic wave device 31, a pair of electrodes including the electrodes 3 and 4 is provided on the first principal surface 2a of the piezoelectric layer 2. Here, K in FIG. 7 represents an intersecting width. As mentioned above, in the acoustic wave device 31 of the present disclosure, the number of pairs of electrodes may include one pair. In this case as well, it is possible to effectively excite the bulk wave in the thickness-shear primary mode when d/p described above is less than or equal to about 0.5, for example.

Preferably, in the acoustic wave device 1, a metallization ratio MR of any of the electrodes 3 and 4 being adjacent each other out of the multiple electrodes 3 and 4 relative to the excitation region being the overlapping region when viewed in the direction in which the electrodes 3 and 4 being adjacent to each other are opposed to each other is desired to satisfy MR about 1.75(d/p)+0.075, for example. Specifically, the region where one or more first electrode fingers and one or more second electrode fingers being adjacent to one another overlap when viewed in the direction in which the first and second electrode fingers are opposed to each other is defined as the excitation region. When the metallization ratio of the one or more first electrode fingers and the one or more second electrode fingers is defined as MR, it is preferable to satisfy MR≤about 1.75(d/p)+0.075, for example. In this case, spurious can be reduced effectively.

Figure 8:
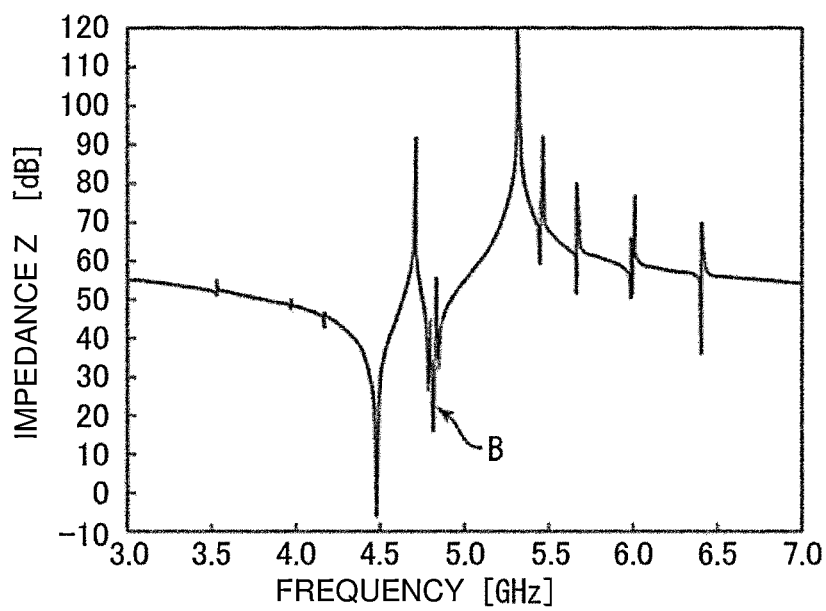
FIG. 8 is a reference graph showing an example of resonance characteristics of the acoustic wave device.

This will be described with reference FIGS. 8 and 9. FIG. 8 is a reference graph showing an example of the resonance characteristics of the above-described acoustic wave device 1. The spurious indicated with an arrow B appears between a resonant frequency and an anti-resonant frequency. Here, d/p is set to be equal to about 0.08 and the Euler angles of LiNbO$_3$ are set to (0°, 0°, 90°), for example. Meanwhile, the aforementioned metallization ratio MR is set to be equal to about 0.35, for example.

The metallization ratio MR will be described with reference to FIG. 1B. When attention is drawn to one pair of the electrodes 3 and 4 in the electrode structure in FIG. 1B, only this pair of the electrodes 3 and 4 is assumed to be provided. In this case, a portion surrounded by a one-dot chain line C defines the excitation region. This excitation region is equivalent to a region of the electrode 3 overlapping the electrode 4, a region of the electrode 4 overlapping the electrode 3, and a region between the electrode 3 and the electrode 4 where the electrode 3 and the electrode 4 overlap each other when the electrode 3 and the electrode 4 are viewed in the direction orthogonal to the longitudinal direction of the electrodes 3 and 4, that is, in the direction in which the electrodes 3 and 4 are opposed to each other. Moreover, a ratio of the area of the electrodes 3 and 4 in the excitation region C relative to the area of this excitation region is equivalent to the metallization ratio MR. In other words, the metallization ratio MR is equivalent to a ratio of the area of a metallization portion to the area of the excitation region.

Here, in the case where more than one pair of electrodes are provided, MR may be defined as a ratio of the metallization portions included in all the excitation regions to a sum of the areas of the excitation regions.

Figure 9:
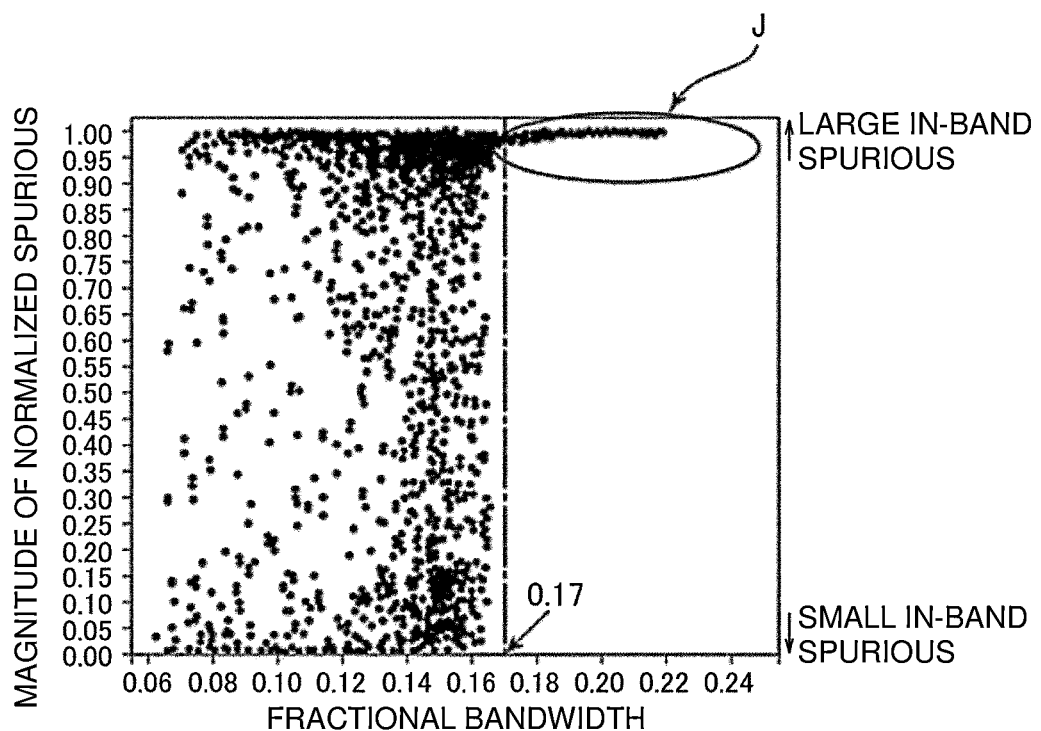
FIG. 9 is a graph showing a relation between a fractional bandwidth in a case of forming numerous acoustic wave resonators and an amount of phase rotation of impedance of spurious normalized at 180 degrees as a magnitude of the spurious.

FIG. 9 is a graph showing a relation between the fractional bandwidth in the case of forming numerous acoustic wave resonators according to the present preferred embodiment and an amount of phase rotation of impedance of the spurious normalized at 180 degrees as a magnitude of the spurious. Here, the fractional bandwidth is adjusted by changing a film thickness of the piezoelectric layer and dimensions of the electrodes in various ways. Although FIG. 9 shows a result in the case of using the piezoelectric layer made of Z-cut LiNbO$_3$, a result has a similar tendency in a case of using a piezoelectric layer of a different cut angle as well.

The spurious reaches as high as about 1.0 in a region surrounded by an ellipse J in FIG. 9, for example. As is clear from FIG. 9, when the fractional bandwidth exceeds about 0.17, that is, when it exceeds about 17%, for example, large spurious having a spurious level greater than or equal to 1 appears in a pass band even when parameters constituting the fractional bandwidth are changed. Specifically, the large spurious indicated with the arrow B appears in the band like the resonance characteristics shown in FIG. 8. Therefore, the fractional bandwidth is preferably less than or equal to about 17%, for example. In this case, it is possible to reduce the spurious by adjusting the film thickness of the piezoelectric layer 2, the dimensions of the electrodes 3 and 4, and the like.

Figure 10:
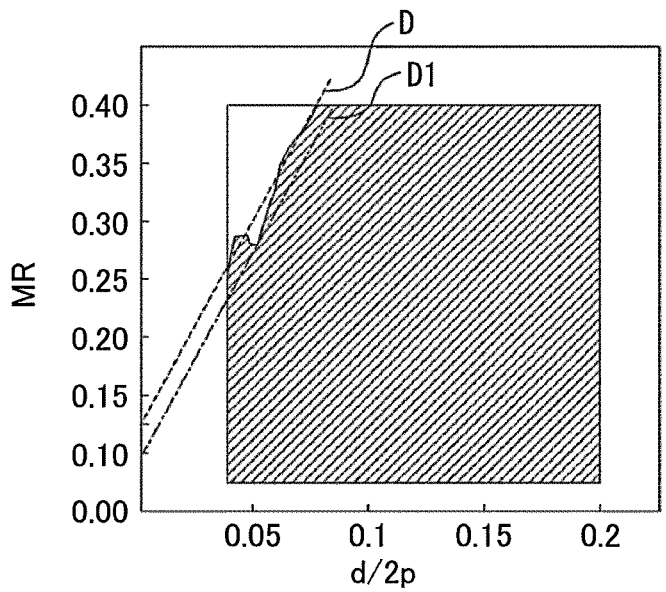
FIG. 10 is a graph showing a relation among d/2p, a metallization ratio MR, and the fractional bandwidth.

FIG. 10 is a graph showing a relation among d/2p, the metallization ratio MR, and the fractional bandwidth. Regarding the above-described acoustic wave device, acoustic wave devices having different values of d/2p and MR are configured and fractional bandwidths thereof are measured. A portion indicated with hatching on the right side of a dashed line D in FIG. 10 is a region where the fractional bandwidth is less than or equal to 17%. A boundary between the region with hatching and a region without hatching is expressed by MR=about 3.5(d/2p)+0.075, that is, MR=about 1.75(d/p)+0.075, for example. Accordingly, MR=about 1.75 (d/p)+0.075 is preferred, for example. In this case, the fractional bandwidth can be set to less than or equal to about 17% easily, for example. A region on the right side of MR=about 3.5(d/2p)+0.05 indicated with a one-dot chain line D1 in FIG. 10 is more preferable, for example. In other words, the fractional bandwidth can surely be set to less than or equal to about 17% when MR≤about 1.75(d/p)+0.05 holds true, for example.

Figure 11:
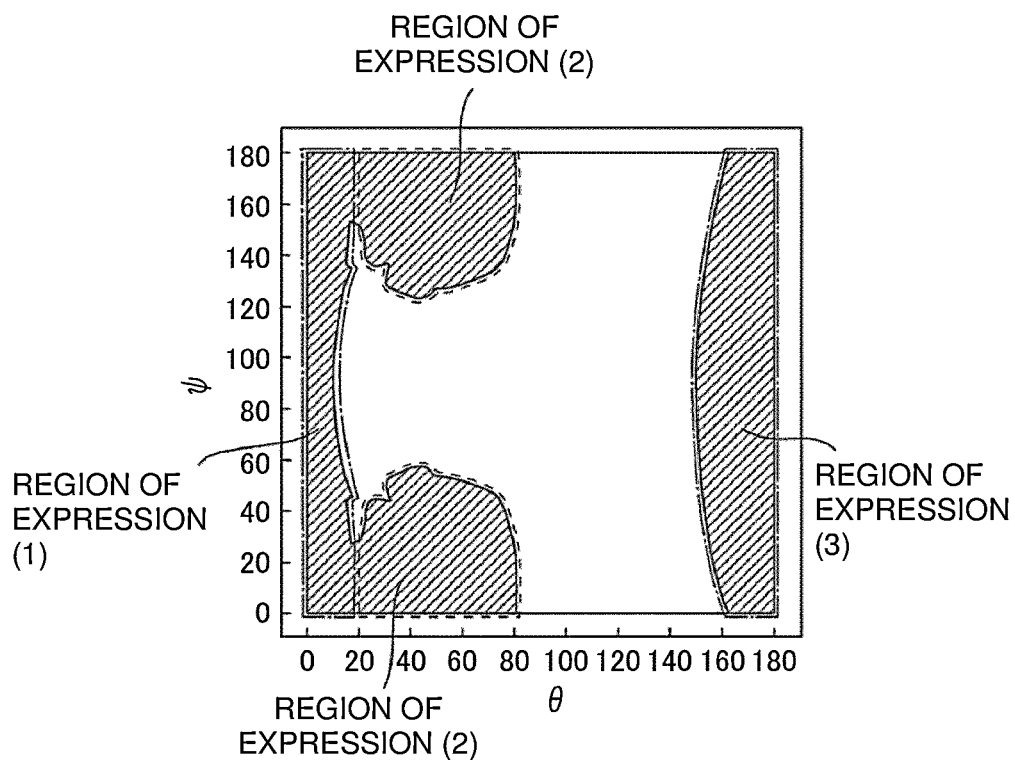
FIG. 11 is a graph showing a map of the fractional bandwidths relative to Euler angles (0°, θ, ψ) of LiNbO$_3$ when d/p is infinitesimally brought close to 0.

FIG. 11 is a graph showing a map of the fractional bandwidths relative to Euler angles (0°, θ, ψ) of LiNbO$_3$ when d/p is infinitesimally brought close to 0. Portions indicated with hatching in FIG. 11 are regions where the fractional bandwidths of at least greater than or equal to about 5%, for example, are available. When ranges of these regions are approximated, the ranges are expressed by expression (1), expression (2), and expression (3) below:

$$(0°\pm10°, 0° \text{ to } 20°, \text{any } \psi) \qquad \text{expression (1);}$$

$$(0°\pm10°, 20° \text{ to } 80°, 0° \text{ to } 60° (1-(\theta-50)^2/900)^{1/2}) \text{ or}$$
$$(0°\pm10°, 20° \text{ to } 80°, [180°-60° (1-(\theta-50)^2/900)^{1/2}] \text{ to } 180°) \qquad \text{expression (2); and}$$

$$(0°\pm10°, [180°-30° (1-(\psi-90)^2/8100)^{1/2}] \text{ to } 180°, \text{any } \psi) \qquad \text{expression (3).}$$

Accordingly, the fractional bandwidth can be sufficiently widened and it is therefore preferable in the case of the range of the Euler angles according to any of the expression (1), the expression (2), and the expression (3) mentioned above.

Figure 12:
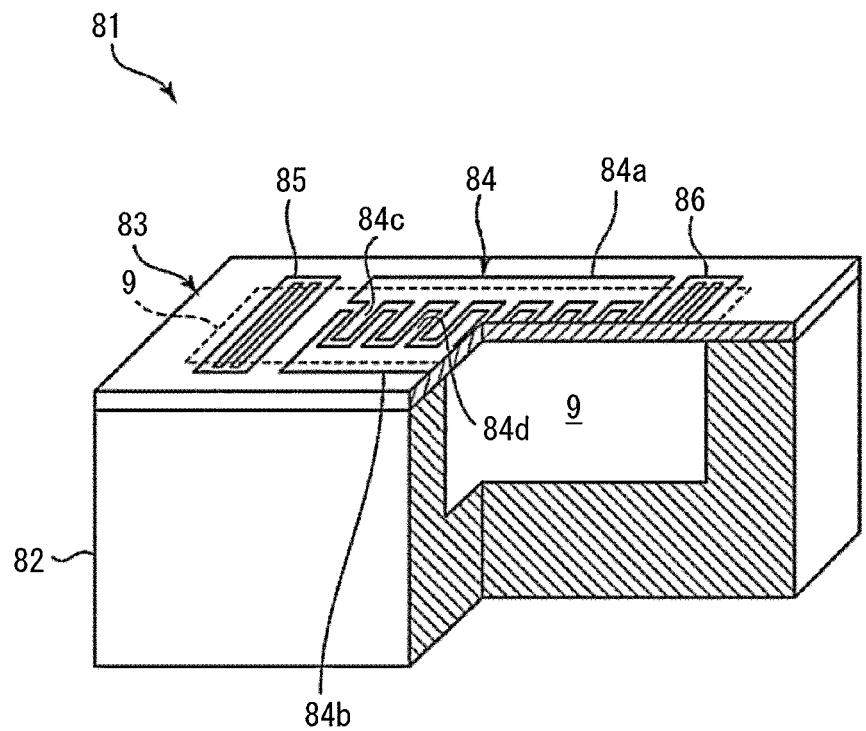
FIG. 12 is a partially cutaway perspective view for explaining the acoustic wave device according to the first preferred embodiment of the present invention.

FIG. 12 is a partially cutaway perspective view for explaining an acoustic wave device according to the first preferred embodiment of the present disclosure. An acoustic wave device 81 includes a support substrate 82. The support substrate 82 is provided with a recess which is open in an upper surface thereof. A piezoelectric layer 83 is disposed on the support substrate 82. Accordingly, the hollow portion 9 is formed. An IDT electrode 84 is provided above this hollow portion 9 and on the piezoelectric layer 83. Reflectors 85 and 86 are provided on both sides of the IDT electrode 84 in a direction of acoustic wave propagation. In FIG. 12, an outer periphery of the hollow portion 9 is indicated with a dashed line. Here, the IDT electrode 84 includes first and second busbars 84a and 84b, electrodes 84c serving as first electrode fingers, and electrodes 84d serving as second electrode fingers. The electrodes 84c are connected to the first busbar 84a. The electrodes 84d are connected to the second busbar 84b. The electrodes 84c and the electrodes 84d are interdigitated with one another.

In the acoustic wave device 81, a Lamb wave as a plate wave is excited by applying an alternating-current electric field to the IDT electrode 84 above the above-described hollow portion 9. Moreover, since the reflectors 85 and 86 are provided on both sides, it is possible to obtain resonance characteristics attributed to the above-mentioned Lamb wave.

As described above, acoustic wave devices according to preferred embodiments of the present invention may use a plate wave.

Second Preferred Embodiment

An acoustic wave device according to a second preferred embodiment will be described. In the second preferred embodiment, explanations of the same features as in the first preferred embodiment will be omitted as appropriate. The explanations in the first preferred embodiment are applicable to the second preferred embodiment.

Figure 13:
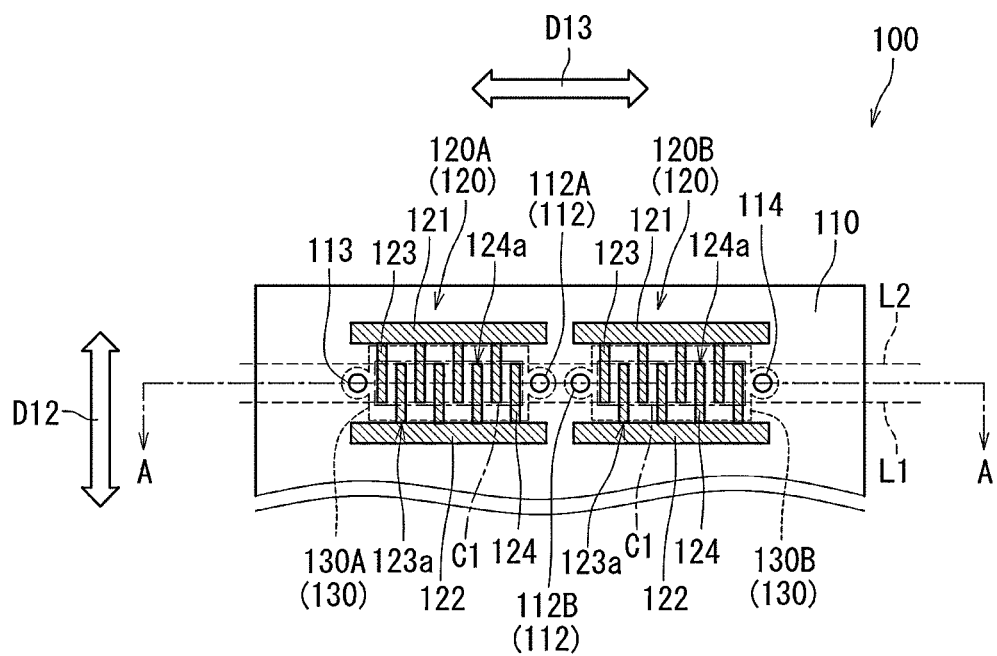
FIG. 13 is a schematic plan view of an acoustic wave device according to a second preferred embodiment of the present invention.
Figure 14:
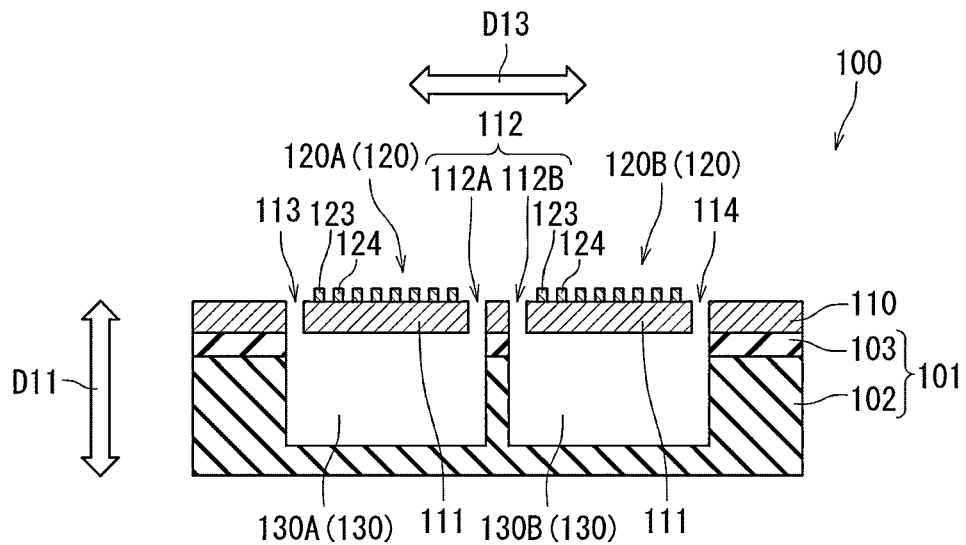
FIG. 14 is a schematic cross-sectional view of the acoustic wave device taken along line A-A in FIG. 13.

FIG. 13 is a schematic plan view of the acoustic wave device according to the second preferred embodiment of the present disclosure. FIG. 14 is a schematic cross-sectional view of the acoustic wave device taken along line A-A in FIG. 13. As shown in FIGS. 13 and 14, an acoustic wave device 100 includes a support member 101, a piezoelectric layer 110, and resonators 120.

The support member 101 includes a support substrate 102 and an intermediate layer 103. For example, the support member 101 is formed from a multilayer body including a support substrate 102 made of Si and an intermediate layer 103 made of $SiO_x$ and disposed on the support substrate 102. Here, the support member 101 only needs to include the support substrate 102 and does not necessarily have to include the intermediate layer 103. In the present specification, the intermediate layer 103 may also be referred to as a joining layer 103.

The support substrate 102 is a substrate having a thickness in a first direction D11. The piezoelectric layer 110 is provided on the support substrate 102. In the present specification, "first direction" is equivalent to a thickness direction of the support substrate 102, which means a stacking direction in which the support member 101 and the piezoelectric layer 110 are stacked.

The support member 101 is provided with hollow portions 130. In the present preferred embodiment, the support member 101 is provided with a first hollow portion 130A and a second hollow portion 130B. The first hollow portion 130A and the second hollow portion 130B are partitioned by a portion of the support member 101. In the present specification, "hollow portion" may also be referred to as "void portion".

The first hollow portion 130A and the second hollow portion 130B are each provided between the support member 101 and the piezoelectric layer 110. In other words, each of the first hollow portion 130A and the second hollow portion 130B is a void defined by the support member 101 and the piezoelectric layer 110. In the present preferred embodiment, the first hollow portion 130A and the second hollow portion 130B are provided in the support substrate 102 and the intermediate layer 103. Specifically, there are provided recesses that are open in a surface of the intermediate layer 103 on a side opposite to a surface in contact with the support substrate 102. The first hollow portion 130A and the second hollow portion 130B are formed by covering the recesses with the piezoelectric layer 110.

Here, the first hollow portion 130A and the second hollow portion 130B only need to be provided at a portion of the support member 101, or may be provided to the intermediate layer 103 without being provided to the support substrate 102. Alternatively, in a case where the support member 101 does not include the intermediate layer 103, the first hollow portion 130A and the second hollow portion 130B may be provided to the support substrate 102.

The piezoelectric layer 110 is provided on the support member 101. The piezoelectric layer 110 is stacked in the first direction D11 of the support member 101. In the present preferred embodiment, the piezoelectric layer 110 is provided on the intermediate layer 103. Specifically, the piezoelectric layer 110 is provided on the surface of the intermediate layer 103 on the side opposite to the surface in contact with the support substrate 102.

In the present specification, portions of the piezoelectric layer 110 located in regions overlapping the first hollow portion 130A and the second hollow portion 130B in plan view will be referred to as membrane portions 111. Here, "plan view" means viewing in the first direction, that is, viewing in the direction in which the support member 101 and the piezoelectric layer 110 are stacked.

The hollow portions 130 only need to be provided to the support member 101 at positions overlapping at least portions of the respective resonators 120 in plan view.

The piezoelectric layer 110 is made of $LiNbO_x$ or $LiTaO_x$, for example. In other words, the piezoelectric layer 110 is made of lithium niobate or lithium tantalate. A thickness of the piezoelectric layer 110 is smaller than a thickness of the intermediate layer 103.

The resonators 120 are provided on the piezoelectric layer 110.

Each of the resonators 120 includes a functional electrode provided on the piezoelectric layer 110. In the present specification, the functional electrode may also be referred to as an electrode portion. In the present preferred embodiment, the functional electrodes include first busbars 121 and second busbars 122 opposed to one another, first electrode fingers 123 connected to the first busbars 121, and second electrode fingers 124 connected to the second busbars 122. The first electrode fingers 123 and the second electrode fingers 124 are interdigitated with one another, and a first electrode finger 123 and a second electrode finger 124 being adjacent to each other form a pair of electrodes.

The functional electrodes constitute IDT electrodes each formed from the first electrode fingers 123, the second electrode fingers 124, the first busbar 121, and the second busbar 122.

The first electrode fingers 123 and the second electrode fingers 124 extend in a second direction D12 intersecting with the first direction D11, and are disposed in such a way as to overlap one another when viewed in a third direction D13 being orthogonal to the second direction D12. The second direction D12 is a direction intersecting with the stacking direction in which the support member 101 and the piezoelectric layer 110 are stacked in a planar direction of the piezoelectric layer 110. The planar direction of the piezoelectric layer 110 is a direction in which a surface of the piezoelectric layer 110 extends in plan view in the first direction D11. The third direction D13 is a direction orthogonal to the second direction D12 and a direction in which the resonators 120 are adjacent to one another in plan view in the first direction D11. Specifically, the third direction D13 is a direction of opposition in which the first electrode fingers 123 and the adjacent second electrode fingers 124 are opposed to one another.

The first electrode fingers 123 and the second electrode fingers 124 are disposed in such a way as to overlap one another when viewed in the third direction D13. Specifically, the first electrode fingers 123 and the second electrode fingers 124 are alternately arranged in the third direction D13. In other words, when viewed in the first direction D11, the first electrode fingers 123 and the second electrode fingers 124 are disposed in such a way as to be adjacent to one another. Meanwhile, when viewed in the third direction D13, the first electrode fingers 123 and the second electrode fingers 124 are disposed in such a way as to overlap one another. To be more precise, a first electrode finger 123 and a second electrode finger 124 adjacent to each other are disposed in such a way as to be opposed to each another, thereby forming a pair of electrodes. In the resonators 120, the pairs of electrodes are disposed in the third direction D13.

The first electrode fingers 123 extend in the second direction D12 being orthogonal to the first direction D11. The second electrode fingers 124 are opposed to any of the first electrode fingers 123 in the third direction D13 orthogonal to the second direction D12, and extend in the second direction D12.

The regions where the first electrode fingers 123 and the second electrode fingers 124 disposed in such a way as to overlap one another in the third direction D13 are excitation regions C1. Specifically, the excitation regions C1 are regions where the first electrode fingers 123 and the second electrode fingers 124 overlap one another when viewed in the direction in which the first electrode fingers 123 and the second electrode fingers 124 being adjacent to one another are opposed to each other.

Here, the number of the first electrode fingers 123 and the number of the second electrode fingers 124 are not limited. The functional electrode may include one or more first electrode finger 123 and/or one or more second electrode finger 124.

Each functional electrode is provided on the piezoelectric layer 110 at a position overlapping the hollow portion 130 in plan view in the first direction D11. Specifically, the functional electrode is provided at the membrane portion 111. Here, the functional electrode only needs to be provided to at least a portion of the membrane portion 111 in plan view in the first direction D11.

In addition, a dielectric film is provided on the piezoelectric layer 110 in such a way as to cover the functional electrode. Note that the dielectric film does not necessarily have to be provided.

The resonators 120 include a first resonator 120A and a second resonator 120B which are disposed adjacent to each other. The first resonator 120A and the second resonator 120B are provided on the piezoelectric layer 110 and are arranged side by side in the third direction D13. Moreover, the first resonator 120A and the second resonator 120B are provided on the same piezoelectric layer 110. In the present specification, the first resonator 120A may also be referred to as a first IDT electrode 120A, and the second resonator 120B may also be referred to as a second IDT electrode 120B.

Through holes 112 that reach the hollow portions 130 are provided in the piezoelectric layer 110 between the first resonator 120A and the second resonator 120B. The through holes 112 are provided at positions of the piezoelectric layer 110 overlapping the hollow portions 130 in plan view in the first direction D11.

Meanwhile, the through holes 112 are provided between a first imaginary line L1 and a second imaginary line L2 in plan view in the first direction D11. The first imaginary line L1 is an imaginary straight line that extends in the third direction D13 while passing through tip ends 123a of the first electrode fingers 123 in plan view in the first direction D11. The second imaginary line L2 is an imaginary straight line that extends in the third direction D13 while passing through tip ends 124a of the second electrode fingers 124 in plan view in the first direction D11.

The through holes 112 are provided in a region extending from the excitation regions C1 in the third direction D13 in plan view in the first direction D11.

In the present preferred embodiment, the through holes 112 include a first through hole 112A and a second through hole 112B provided between the first resonator 120A and the second resonator 120B.

The first through hole 112A is provided at a position overlapping the region where the first hollow portion 130A is provided in plan view in the first direction D11. Moreover, the first through hole 112A is provided at a position closer to the first resonator 120A than to the second resonator 120B in plan view in the first direction D11. The first through hole 112A communicates with the first hollow portion 130A.

The second through hole 112B is provided at a position overlapping the region where the second hollow portion 130B is provided in plan view in the first direction D11. Moreover, the second through hole 112B is provided at a position closer to the second resonator 120B than to the first resonator 120A in plan view in the first direction D11. The second through hole 112B communicates with the second hollow portion 130B.

An opening area of the first through hole 112A is equal to an opening area of the second through hole 112B in plan view in the first direction D11. Each of the first through hole 112A and the second through hole 112B has a circular shape in plan view in the first direction D11, for example.

The first through hole 112A and the second through hole 112B are provided at positions overlapping each other when viewed in the third direction D13 in which the first resonator 120A is adjacent to the second resonator 120B.

Meanwhile, a third through hole 113 that reaches the hollow portion 130 is provided to the first resonator 120A on a side opposite to the side adjacent to the second resonator 120B. The third through hole 113 is provided at a position overlapping the region of the piezoelectric layer 110 where the first hollow portion 130A is provided in plan view in the first direction D11. The third through hole 113 communicates with the first hollow portion 130A.

Meanwhile, a fourth through hole 114 that reaches the hollow portion 130 is provided to the second resonator 120B on a side opposite to the side adjacent to the first resonator 120A. The fourth through hole 114 is provided at a position overlapping the region of the piezoelectric layer 110 where the second hollow portion 130B is provided in plan view in the first direction D11. The fourth through hole 114 communicates with the second hollow portion 130B.

The third through hole 113 and the fourth through hole 114 are provided between the first imaginary line L1 and the second imaginary line L2 in plan view in the first direction D11. In the present preferred embodiment, the first through hole 112A, the second through hole 112B, the third through hole 113, and the fourth through hole 114 are provided at positions overlapping one another when viewed in the third direction D13.

The first resonator 120A is disposed between the first through hole 112A and the third through hole 113 in plan view in the first direction D11. In other words, the through holes 112A and 113 are provided on both sides of the first resonator 120A. The second resonator 120B is disposed between the second through hole 112B and the fourth through hole 114 in plan view in the first direction D11. In other words, the through holes 112B and 114 are provided on both sides of the second resonator 120B.

The acoustic wave device 100 according to the present preferred embodiment includes the support member 101 including the support substrate 102 having the thickness direction in the first direction D11, the piezoelectric layer 110 provided on the support member 101, and the resonators 120 each including the functional electrode provided on the piezoelectric layer 110. The support member 101 is provided with the hollow portions 130 which overlap at least parts of the respective resonators 120 in plan view in the first direction D11. The resonators 120 include the first resonator 120A and the second resonator 120B disposed adjacent to each other. In the piezoelectric layer 110, the through holes 112 that reach the hollow portions 130 are provided between the first resonator 120A and the second resonator 120B.

The above-described configuration makes it possible to reduce or prevent deterioration of characteristics of the acoustic wave device 100. For example, there is a case where an unnecessary wave propagating in a direction (the third direction D13) in which the electrode fingers 123 and 124 are arranged occurs in each of the resonators 120 that are adjacent to each other. According to the acoustic wave device 100, the through holes 112 are provided between the resonators 120 being adjacent to each other. For this reason, when the unnecessary wave occurs in one of the resonators and propagates to the other resonator, it is possible to cause the unnecessary wave to collide with the through holes 112 so as to scatter the wave. In this way, an intensity of the unnecessary wave between the adjacent resonators 120 can be reduced so as to reduce or prevent a leakage of the unnecessary wave. As a consequence, it is possible to reduce or prevent deterioration of characteristics of the acoustic wave device 100.

The first resonator 120A and the second resonator 120B are provided on the same piezoelectric layer 110. According to the above-described configuration, the through holes 112 can scatter the unnecessary wave even in a configuration in which the unnecessary wave propagates easily due to provision of the first resonator 120A and the second resonator 120B on the same piezoelectric layer 110, thereby reducing or preventing deterioration of the characteristics of the acoustic wave device 100.

The through holes 112 include the first through hole and the second through hole provided between the first resonator 120A and the second resonator. The above-described configuration makes it possible to scatter the unnecessary wave more easily, thereby reducing or preventing deterioration of the characteristics of the acoustic wave device 100 more appropriately.

The first through hole 112A and the second through hole 112B are provided at positions overlapping each other when viewed in the direction (the third direction D13) in which the first resonator 120A and the second resonator 120B are adjacent to each other. According to the above-described configuration, provision of the first through hole 112A and the second through hole 112B makes it possible to scatter the unnecessary wave more easily, thereby reducing or preventing deterioration of the characteristics of the acoustic wave device 100 more appropriately.

The functional electrode includes the first busbar 121, the second busbar 122 opposed to the first busbar 121, one or more first electrode fingers 123 provided to the first busbar 121 and extending toward the second busbar 122, and one or more second electrode finger 124 provided to the second busbar 122 and extending toward the first busbar 121. The one or more first electrode fingers 123 and the one or more second electrode fingers 124 extend in the second direction D12 intersecting with the first direction D11, and are disposed in such a way as to overlap one another when viewed in the third direction D13 being orthogonal to the second direction D12. The through holes 112 are provided between the first imaginary line L1 passing through the tip ends 123a of the one or more first electrode fingers 123 and the second imaginary line L2 passing through the tip ends 124a of the one or more second electrode fingers 124 in plan view in the first direction D11. The above-described configuration makes it possible to scatter the unnecessary wave more easily, thereby reducing or preventing deterioration of the characteristics of the acoustic wave device 100. The region between the first resonator 120A and the second resonator 120B and between the first imaginary line L1 and the second imaginary line L2 is a region extending from the excitation regions C1 where the one or more first electrode fingers 123 and the adjacent one or more second electrode fingers 124 overlap one another. For this reason, the unnecessary wave tends to occur from the resonators, and the unnecessary wave propagates easily as compared to other portions. Provision of the through holes 112 between the first imaginary line L1 and the second imaginary line L2 makes it possible to scatter the unnecessary wave more easily. Thus, deterioration of the characteristics of the acoustic wave device 100 can be reduced or prevented more appropriately.

The third through hole 113 that reaches the hollow portion 130 is provided to the first resonator 120A on the side opposite to the side adjacent to the second resonator 120B. The fourth through hole 114 that reaches the hollow portion 130 is provided to the second resonator 120B on the side opposite to the side adjacent to the first resonator 120A. The third through hole 113 and the fourth through hole 114 are provided between the first imaginary line L1 and the second imaginary line L2 in plan view in the first direction D11. According to the above-described configuration, the third through hole 113 and the fourth through hole 114 can scatter the unnecessary wave that would leak out on the opposite sides of the resonators being adjacent to each other, thereby reducing or preventing the leakage of the unnecessary wave more reliably.

The hollow portions 130 include the first hollow portion 130A provided at the position overlapping at least a portion of the first resonator 120A in plan view in the first direction D11, and the second hollow portion 130B provided at the position overlapping at least a portion of the second resonator 120B in plan view in the first direction D11. The first hollow portion 130A and the second hollow portion 130B are partitioned by a portion of the support member 101. The above-described configuration can reduce or prevent propagation of the unnecessary wave between the first resonator 120A and the second resonator 120B.

Although the present preferred embodiment has described the example in which the two through holes 112 are provided between the first resonator 120A and the second resonator 120B, the present disclosure is not limited to this configuration. For example, one or more through holes 112 may be provided between the first resonator 120A and the second resonator 120B.

Meanwhile, the present preferred embodiment has described the example in which the piezoelectric layer 110 is provided with the third through hole 113 and the fourth through hole 114. However, the present disclosure is not limited to this configuration. For example, the piezoelectric layer 110 does not necessarily have to be provided with the third through hole 113 and/or the fourth through hole 114.

Moreover, the through holes 112 to 114 can also be used as etching holes to introduce an etchant, for example.

The present preferred embodiment has described the example in which the functional electrodes are provided on the piezoelectric layer 110. However, the present disclosure is not limited to this configuration. The functional electrodes only need to be provided to the piezoelectric layer 110 in the first direction D11. For instance, the functional electrodes may be provided on the side of the piezoelectric layer 110 where the hollow portion 130 is provided.

Modifications of the second preferred embodiment will be described below.

Modification 1

Figure 15:
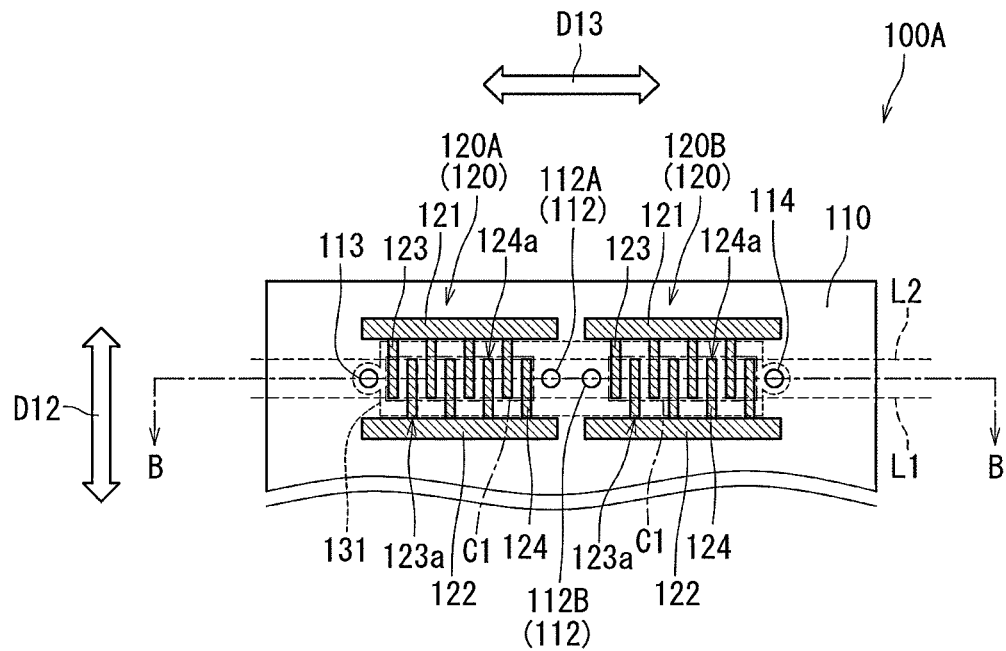
FIG. 15 is a schematic plan view of an acoustic wave device of Modification 1 of a preferred embodiment of the present invention.
Figure 16:
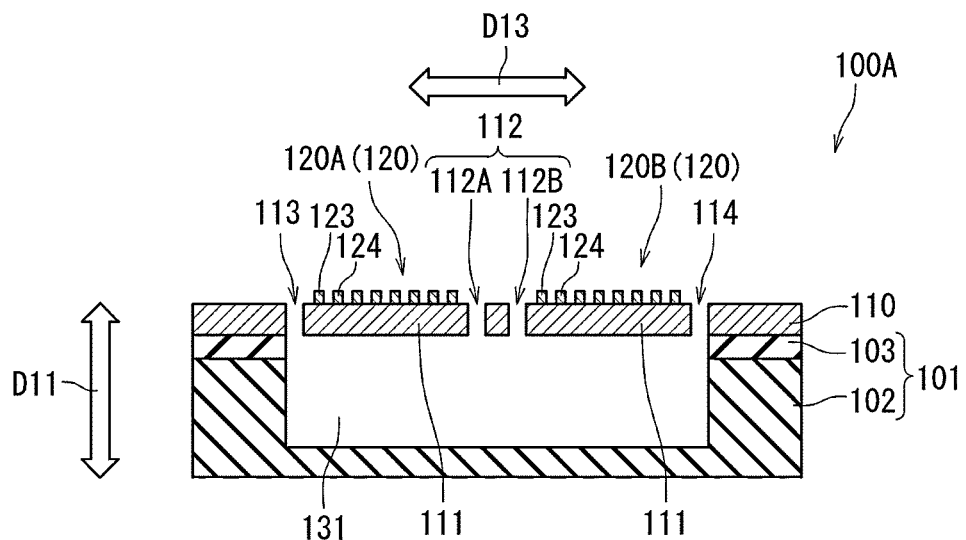
FIG. 16 is a schematic cross-sectional view of the acoustic wave device taken along line B-B in FIG. 15.

FIG. 15 is a schematic plan view of an acoustic wave device of Modification 1 of a preferred embodiment of the present invention. FIG. 16 is a schematic cross-sectional view of the acoustic wave device taken along line B-B in FIG. 15. As shown in FIGS. 15 and 16, an acoustic wave device 100A is different from the acoustic wave device 100 of the second preferred embodiment in that a hollow portion 131 is formed as a single hollow portion.

In the acoustic wave device 100A, the hollow portion 131 is the single hollow portion that is provided at a position overlapping at least a portion of the first resonator 120A and of the second resonator 120B in plan view in the first direction D11. The first through hole 112A, the second through hole 112B, the third through hole 113, and the fourth through hole 114 communicate with the hollow portion 131.

This configuration can also reduce or prevent deterioration of characteristics of the acoustic wave device 100A due to a leakage of an unnecessary wave between the resonators 120 that are adjacent to each other.

Modification 2

Figure 17:
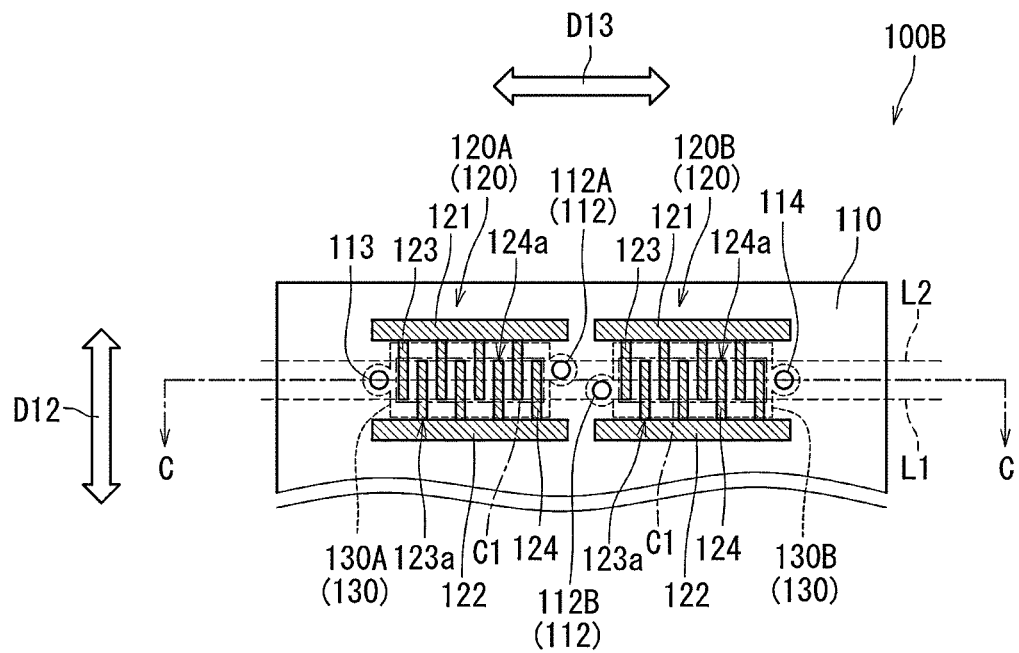
FIG. 17 is a schematic plan view of an acoustic wave device of Modification 2 of a preferred embodiment of the present invention.
Figure 18:
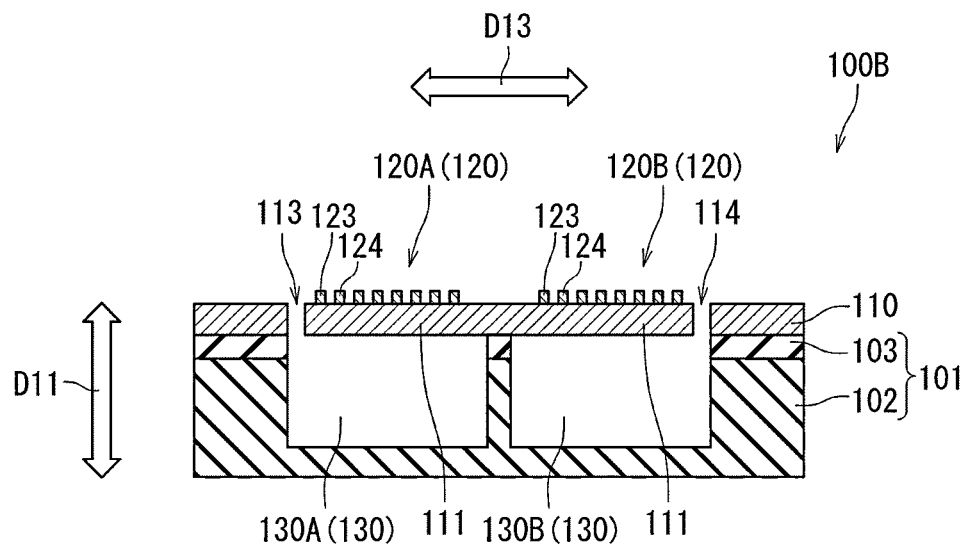
FIG. 18 is a schematic cross-sectional view of the acoustic wave device taken along line C-C in FIG. 17.

FIG. 17 is a schematic plan view of an acoustic wave device of Modification 2 of a preferred embodiment of the present invention. FIG. 18 is a schematic cross-sectional view of the acoustic wave device taken along line C-C in FIG. 17. As shown in FIGS. 17 and 18, an acoustic wave device 100B is different from the acoustic wave device 100 of the second preferred embodiment in that the first through hole 112A and the second through hole 112B are provided at positions not overlapping each other when viewed in the third direction D13.

In the acoustic wave device 100B, the first through hole 112A and the second through hole 112B are provided at the positions not overlapping each other when viewed in the direction (the third direction D13) in which the first resonator 120A and the second resonator 120B are adjacent to each other. That is to say, the first through hole 112A and the second through hole 112B are provided at positions not opposed to each other in plan view in the first direction D11. For example, the first through hole 112A is provided at a position closer to the first busbar 121 than to the second busbar 122. The second through hole 112B is provided at a position closer to the second busbar 122 than to the first busbar 121.

According to the above-described configuration, the through holes 112A and 112B can be provided in a wider range when viewed in the direction (the third direction D13) in which the first resonator 120A and the second resonator 120B are adjacent to each other. This makes it possible to reduce or prevent a leakage of the unnecessary wave between the resonators 120 adjacent to each other, thereby reducing or preventing deterioration of characteristics of the acoustic wave device 100B.

Note that the positions of the first through hole 112A and the second through hole 112B are not limited to Modification 2. For example, the first through hole 112A may be provided at a position closer to the second busbar 122 than to the first busbar 121, and the second through hole 112B may be provided at a position closer to the first busbar 121 than to the second busbar 122.

Modification 3

Figure 19:
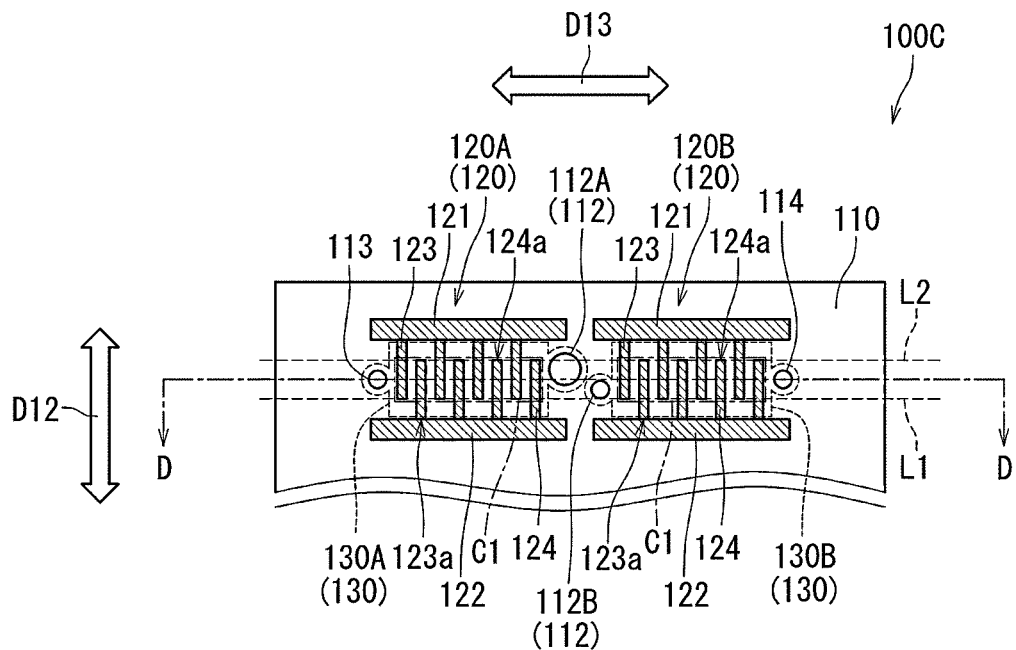
FIG. 19 is a schematic plan view of an acoustic wave device of Modification 3 of a preferred embodiment of the present invention.
Figure 20:
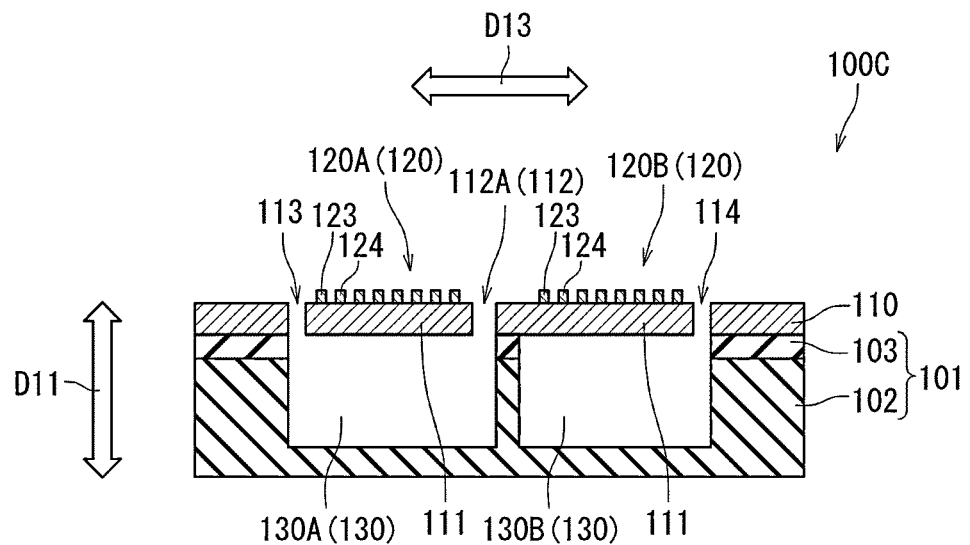
FIG. 20 is a schematic cross-sectional view of the acoustic wave device taken along line D-D in FIG. 19.

FIG. 19 is a schematic plan view of an acoustic wave device of Modification 3 of a preferred embodiment of the present invention. FIG. 20 is a schematic cross-sectional view of the acoustic wave device taken along line D-D in FIG. 19. As shown in FIGS. 19 and 20, an acoustic wave device 100C is different from the acoustic wave device 100B of Modification 2 in that a size of the first through hole 112A is different from a size of the second through hole 112B.

In the acoustic wave device 100C, the opening area of the first through hole 112A is different from the opening area of the second through hole 112B in plan view in the first direction D11. For example, the opening area of the first through hole 112A is larger than the opening area of the second through hole 112B. In Modification 3, each of the first through hole 112A and the second through hole 112B has a circular shape in plan view in the first direction D11, and a diameter of the first through hole 112A is larger than a diameter of the second through hole 112B.

The above-described configuration makes it possible to reduce or prevent a leakage of the unnecessary wave between the resonators 120 adjacent to each other, thereby reducing or preventing deterioration of characteristics of the acoustic wave device 100C.

Here, the sizes of the first through hole 112A and the second through hole 112B are not limited to Modification 3. For example, the opening area of the second through hole 112B may be larger than the opening area of the first through hole 112A.

Modification 4

Figure 21:
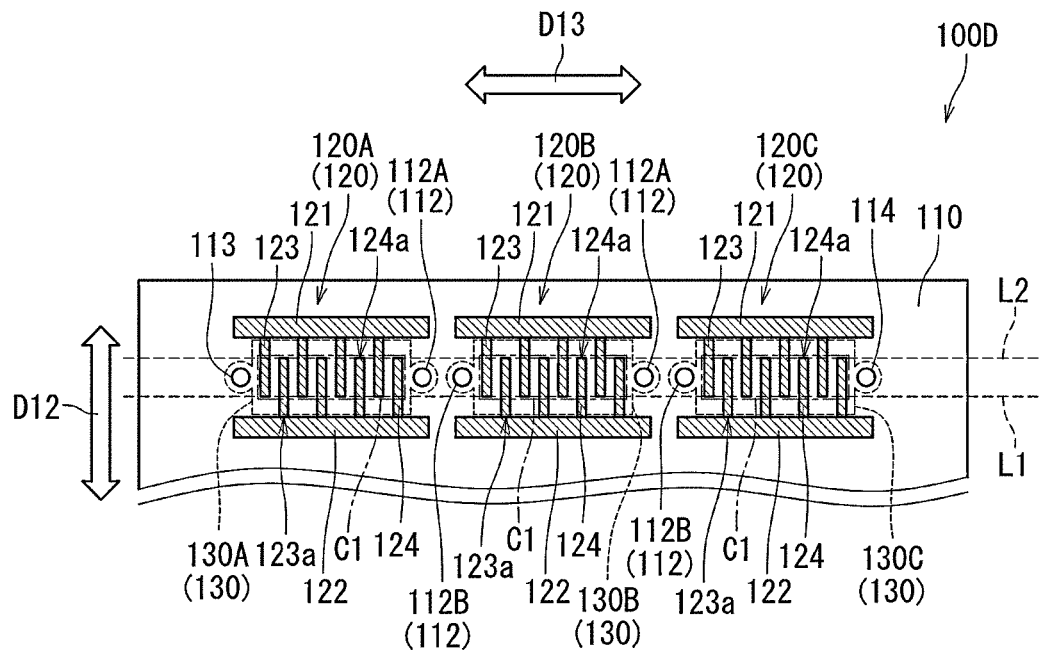
FIG. 21 is a schematic plan view of an acoustic wave device of Modification 4 of a preferred embodiment of the present invention.

FIG. 21 is a schematic plan view of an acoustic wave device of Modification 4 of a preferred embodiment of the present invention. As shown in FIG. 21, an acoustic wave device 100D is different from the acoustic wave device 100 of the second preferred embodiment in that three resonators 120 are disposed on the piezoelectric layer 110.

In the acoustic wave device 100D, the three resonators 120 are arranged side by side in the third direction D13. The three resonators 120 include the first resonator 120A, the second resonator 120B, and a third resonator 120C. In the third direction D13, the first resonator 120A is adjacent to the second resonator 120B, and the second resonator 120B is adjacent to the third resonator 120C. In plan view in the first direction D11, the first hollow portion 130A, the second hollow portion 130B, and a third hollow portion 130C are provided in the piezoelectric layer 110 at positions overlapping the first resonator 120A, the second resonator 120B, and the third resonator 120C, respectively.

The first through holes 112A and the second through holes 112B are provided between the first resonator 120A and the second resonator 120B and between the second resonator 120B and the third resonator 120C. The third through hole 113 that reaches the first hollow portion 130A is provided to the first resonator 120A on the side opposite to the side adjacent to the second resonator 120B. The fourth through hole 114 that reaches the third hollow portion 130C is provided to the third resonator 120C on a side opposite to a side adjacent to the second resonator 120B.

The above-described configuration makes it possible to reduce or prevent a leakage of the unnecessary wave between the resonators 120 adjacent to each other even when the three resonators 120 are arranged side by side, thereby reducing or preventing deterioration of characteristics of the acoustic wave device 100D.

Here, the number of the resonators 120 is not limited to three. The number of the resonators 120 may be more than three.

Modification 5

Figure 22:
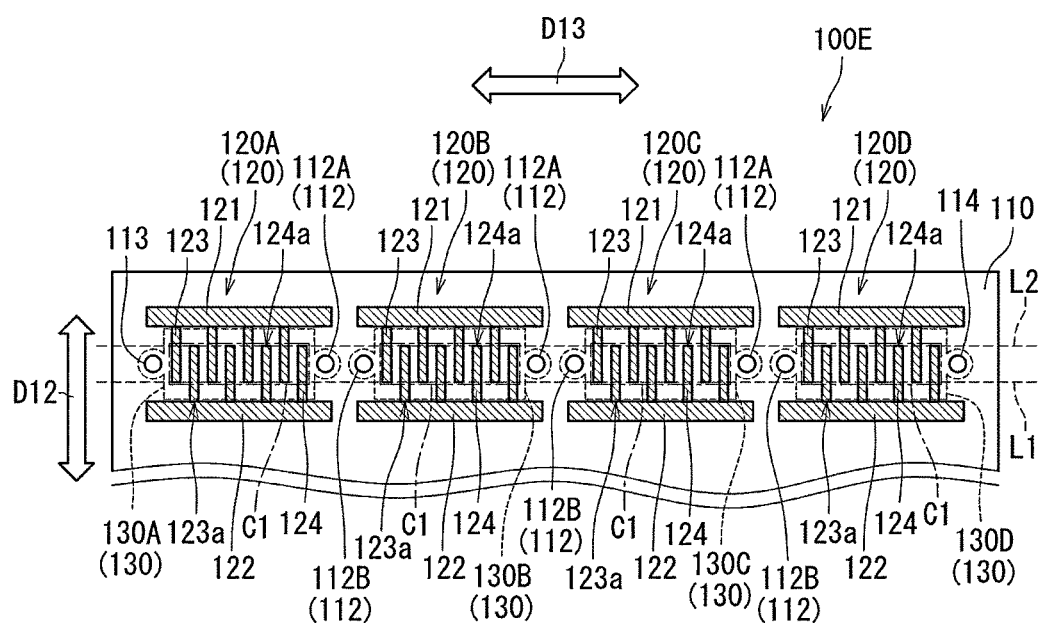
FIG. 22 is a schematic plan view of an acoustic wave device of Modification 5 of a preferred embodiment of the present invention.

FIG. 22 is a schematic plan view of an acoustic wave device of Modification 5 of a preferred embodiment of the present invention. As shown in FIG. 22, an acoustic wave device 100E is different from the acoustic wave device 100D of Modification 4 in that four resonators 120 are disposed on the piezoelectric layer 110.

In the acoustic wave device 100E, the four resonators 120 are arranged side by side in the third direction D13. The four resonators 120 include the first resonator 120A, the second resonator 120B, a third resonator 120C, and a fourth resonator 120D. In the third direction D13, the first resonator 120A is adjacent to the second resonator 120B, the second resonator 120B is adjacent to the third resonator 120C, the third resonator 120C is adjacent to the fourth resonator 120D. In plan view in the first direction D11, the first hollow portion 130A, the second hollow portion 130B, a third hollow portion 130C, and a fourth hollow portion 130D are provided in the piezoelectric layer 110 at positions overlapping the first resonator 120A, the second resonator 120B, the third resonator 120C, and the fourth resonator 120D, respectively.

The first through holes 112A and the second through holes 112B are provided between the first resonator 120A and the second resonator 120B, between the second resonator 120B and the third resonator 120C, and between the third resonator 120C and the fourth resonator 120D. The third through hole 113 that reaches the first hollow portion 130A is provided to the first resonator 120A on the side opposite to the side adjacent to the second resonator 120B. The fourth through hole 114 that reaches the fourth hollow portion 130D is provided to the fourth resonator 120D on a side opposite to a side adjacent to the third resonator 120C. In the acoustic wave device 100E, the piezoelectric layer 110 is provided with the eight through holes 112, 113, and 114. The eight through holes 112, 113, and 114 are disposed between the first imaginary line L1 and the second imaginary line L2 in plan view in the first direction D11.

The above-described configuration makes it possible to reduce or prevent a leakage of the unnecessary wave between the resonators 120 adjacent to each other even when the four resonators 120 are arranged side by side, thereby reducing or preventing deterioration of characteristics of the acoustic wave device 100D.

Meanwhile, by setting the number of the through holes 112, 113, and 114 provided between the first imaginary line L1 and the second imaginary line L2 in plan view in the first direction D11 to less than or equal to eight, it is possible to reduce or prevent a leakage of the unnecessary wave while curbing an increase in vulnerability of the piezoelectric layer 110 due to the through holes.

Third Preferred Embodiment

An acoustic wave device according to a third preferred embodiment will be described. In the third preferred embodiment, explanations of the same features as in the first and second preferred embodiments will be omitted as appropriate. The explanations in the first and second preferred embodiments are applicable to the third preferred embodiment.

Figure 23:
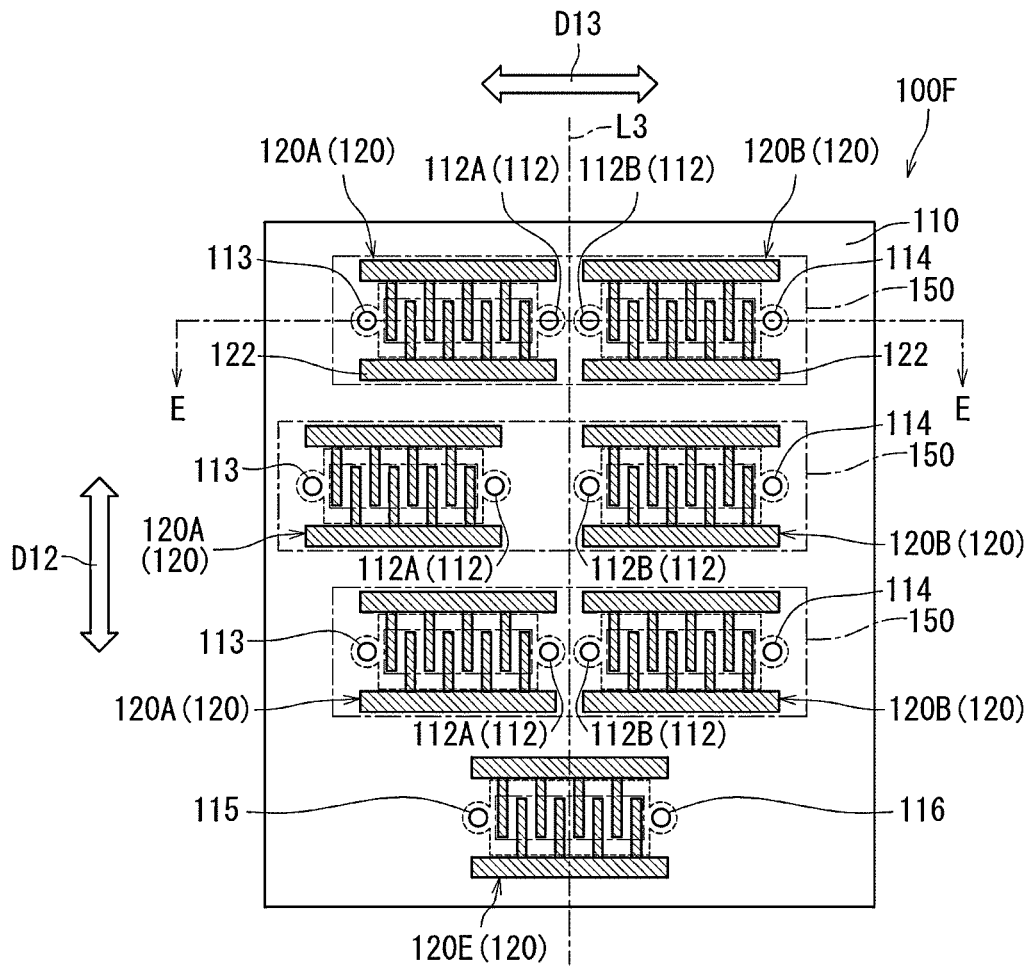
FIG. 23 is a schematic plan view of an acoustic wave device according to a third preferred embodiment of the present invention.
Figure 24:
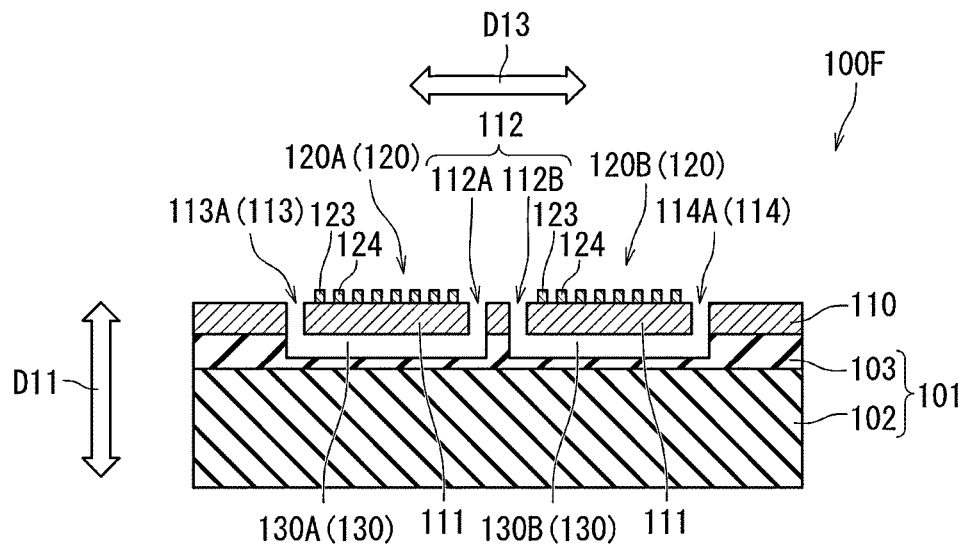
FIG. 24 is a schematic cross-sectional view of the acoustic wave device taken along line E-E in FIG. 23.

FIG. 23 is a schematic plan view of an acoustic wave device according to the third preferred embodiment of the present disclosure. FIG. 24 is a schematic cross-sectional view of the acoustic wave device taken along line E-E in FIG. 23. As shown in FIGS. 23 and 24, a total number of through holes 112 to 116 is an even number in an acoustic wave device 100F. In the present preferred embodiment, fourteen through holes 112 to 116 are provided on the piezoelectric layer 110.

In the acoustic wave device 100F, the resonators 120 are provided on the piezoelectric layer 110. The first resonators 120A, the second resonators 120B, and a third resonator 120E are provided on the piezoelectric layer 110. The first resonators 120A are arranged side by side in the second direction D12. The second resonators 120B are arranged side by side in the second direction D12, and are disposed adjacent to the first resonators 120A in the third direction D13.

The first resonators 120A and the second resonators 120B being adjacent to each other in the third direction D13 form electrode pairs. Such electrode pairs 150 are arranged side by side in the second direction D12. The third resonator 120E is disposed in the second direction D12 in which the electrode pairs 150 are arranged. Here, among the electrode pairs 150, distances between the first resonator 120A and the second resonator 120B may be different from or equal to one another.

In the present preferred embodiment, three electrode pairs 150 and one third resonator 120E are provided on the piezoelectric layer 110.

The through holes 112 to 116 that extend through the piezoelectric layer 110 are provided to the piezoelectric layer 110 with the functional electrodes interposed therebetween. To be more precise, the first through holes 112A and the third through holes 113 are provided on both sides of the first resonators 120A. The second through holes 112B and the fourth through holes 114 are provided on both sides of the second resonators 120B. A fifth through hole 115 and a sixth through hole 116 are provided on both sides of the third resonator 120E. The through holes 112 to 116 are provided in such a way as to reach the respective hollow portions 130.

In plan view of the piezoelectric layer 110 in the first direction D11, the first resonators 120A and the second resonators 120B are partitioned by an imaginary partition line L3. The imaginary partition line L3 is an imaginary straight line that passes between the first resonators 120A and the second resonators 120B, which are adjacent to each other, in plan view of the piezoelectric layer 110 in the first direction D11.

The first resonators 120A are provided on the piezoelectric layer 110 on one side partitioned by the imaginary partition line L3. The second resonators 120B are provided on the piezoelectric layer 110 on another side partitioned by the imaginary partition line L3. Meanwhile, the third resonator 120E is disposed at a position where the imaginary partition line L3 passes. Here, "one side partitioned by the imaginary partition line L3" means the left side of the imaginary partition line L3 when viewed in the first direction D11 in FIG. 23, and "another side partitioned by the imaginary partition line L3" means the right side of the imaginary partition line L3 when viewed in the first direction D11 in FIG. 23.

The number of the through holes 112, 113, and 115 provided on the one side of the imaginary partition line L3 is equal to the number of the through holes 112, 114, and 116 provided on the other side of the imaginary partition line L3. In the present preferred embodiment, seven through holes 112A, 113, and 115 are provided on the one side of the imaginary partition line L3. Seven through holes 112B, 114, and 116 are also provided on the other side of the imaginary partition line L3.

To be more precise, three first through holes 112A, three third through holes 113, and a fifth through hole 115 are provided on the piezoelectric layer 110 on the one side of the imaginary partition line L3. Three second through holes 112B, three fourth through holes 114, and a sixth through hole 116 are provided on the piezoelectric layer 110 on the other side of the imaginary partition line L3.

According to the acoustic wave device 100F of the present preferred embodiment, the total number of the through holes 112 to 116 provided to the piezoelectric layer 110 is an even number. When the first resonators 120A and the second resonators 120B adjacent to each other are deemed as the electrode pairs 150 in the above-described configuration, it is easy to symmetrically arrange the through holes 112 to 114 in the piezoelectric layer 110, and a variation in deflection per unit area of the piezoelectric layer 110 is therefore reduced. In this way, it is possible to reduce or prevent deterioration of characteristics of the acoustic wave device 100F.

The number of the through holes 112A, 113, and 115 provided on the one side of the imaginary partition line L3 partitioning between the first resonator 120A and the second resonator 120B is equal to the number of the through holes 112B, 114, and 116 provided on the other side of the imaginary partition line L3. According to the above-described configuration, the variation in deflection per unit area of the piezoelectric layer 110 can be reduced further. Thus, it is possible to reduce or prevent deterioration of characteristics of the acoustic wave device 100F more appropriately.

Modifications of the third preferred embodiment will be described below.

Modification 6

Figure 25:
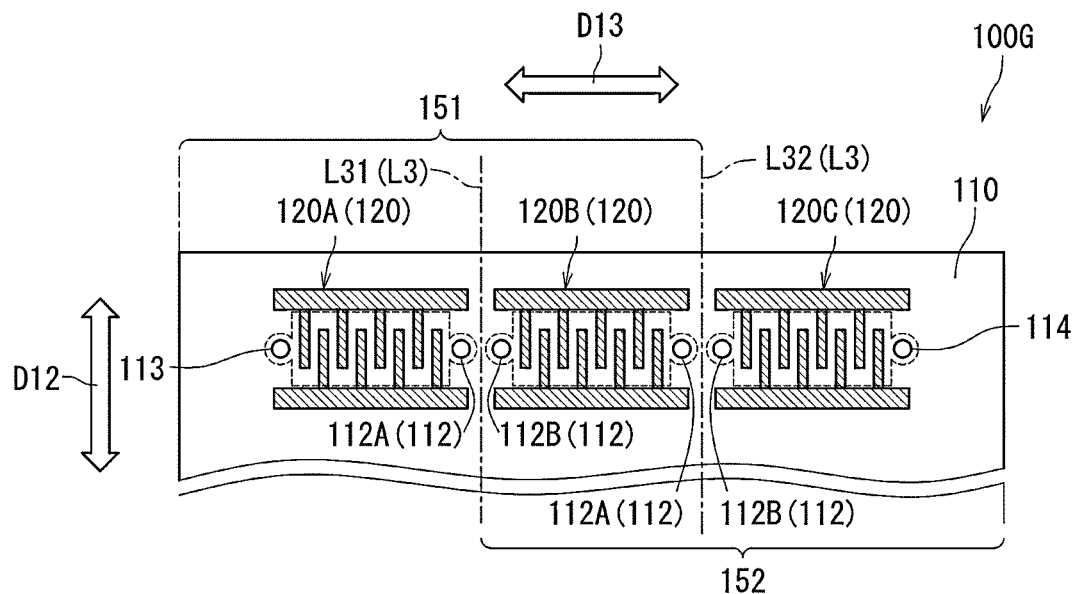
FIG. 25 is a schematic plan view of an acoustic wave device of Modification 6 of a preferred embodiment of the present invention.

FIG. 25 is a schematic plan view of an acoustic wave device of Modification 6 of a preferred embodiment of the present invention. As shown in FIG. 25, an acoustic wave device 100G is different from the acoustic wave device 100F in that three resonators 120 are arranged side by side in the third direction D13 on the piezoelectric layer 110.

In plan view of the piezoelectric layer 110 in the first direction D11, the first resonator 120A and the second resonator 120B are adjacent to each other while the second resonator 120B and the third resonator 120C are adjacent to each other. In the acoustic wave device 100G, the first resonator 120A and the second resonator 120B form a first electrode pair 151 while the second resonator 120B and the third resonator 120C form a second electrode pair 152.

In the acoustic wave device 100G, a first imaginary partition line L31 and a second imaginary partition line L32 are provided on the piezoelectric layer 110. The first imaginary partition line L31 is an imaginary straight line serving as a partition between the first resonator 120A and the second resonator 120B being adjacent to each other. The second imaginary partition line L32 is an imaginary straight line serving as a partition between the second resonator 120B and the third resonator 120C being adjacent to each other.

As described above, "resonators being adjacent to each other" partitioned by the imaginary partition lines L3 includes a state where at least parts of the resonators overlap each other when viewed in the direction in which the first electrode fingers and the second electrode fingers are arranged, that is, in the third direction D13. In the present preferred embodiment, the second resonator 120B defines the first electrode pair 151 and the second electrode pair 152, and is therefore shared by the two electrode pairs 151 and 152.

The number of the through holes 112A and 113 provided to the piezoelectric layer 110 on one side of the first imaginary partition line L31 is equal to the number of the through holes 112A and 112B provided between the first imaginary partition line L31 and the second imaginary partition line L32. Meanwhile, the number of the through holes 112A and 112B provided between the first imaginary partition line L31 and the second imaginary partition line L32 is equal to the number of the through holes 112B and 114 provided to the piezoelectric layer 110 on another side of the second imaginary partition line L32. Here, "one side of the first imaginary partition line L31" means the left side of the first imaginary partition line L31 when viewed in the first direction D11 in FIG. 25, and "another side of the second imaginary partition line L32" means the right side of the second imaginary partition line L32 when viewed in the first direction D11 in FIG. 25.

A variation in deflection per unit area of the piezoelectric layer 110 is also reduced in the above-described configuration. In this way, it is possible to reduce or prevent deterioration of characteristics of the acoustic wave device 100G.

Here, the number of the resonators 120 is not limited to three. For example, the number of the resonators 120 may be greater than or equal to three.

Modification 7

Figure 26:
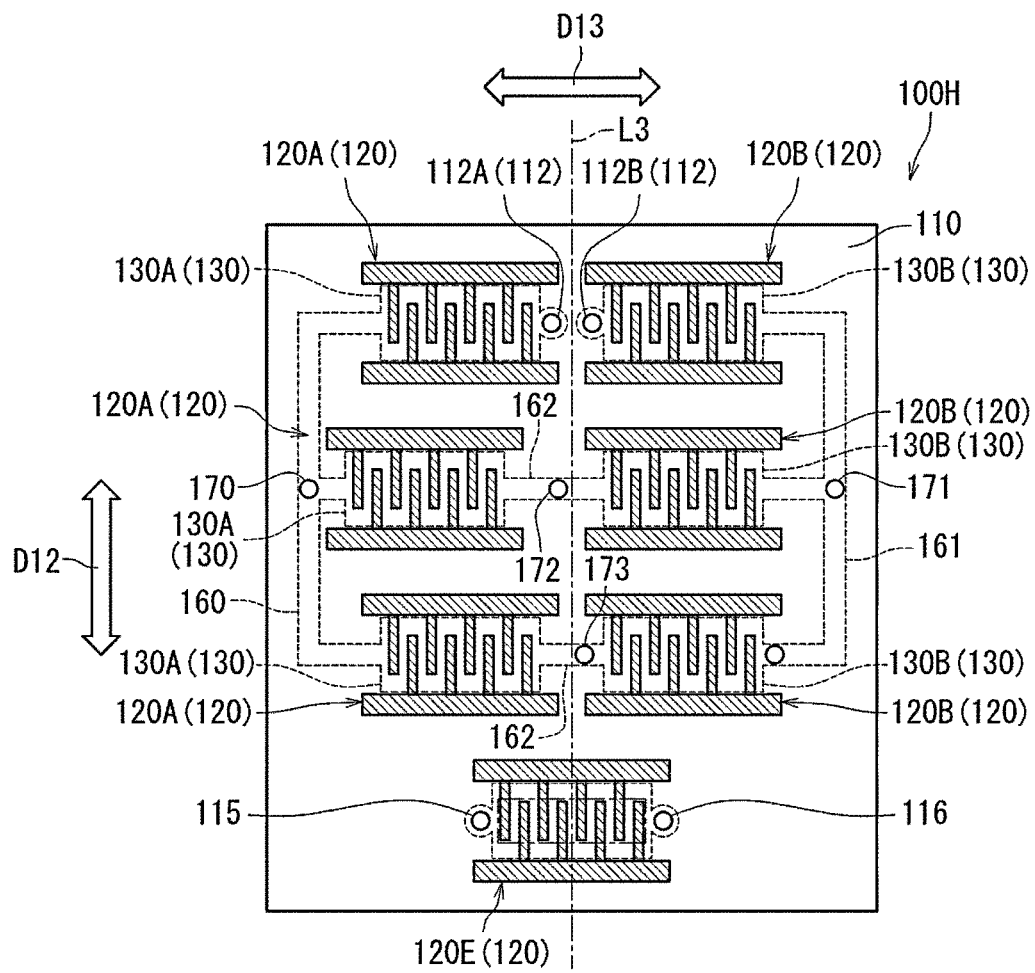
FIG. 26 is a schematic plan view of an acoustic wave device of Modification 7 of a preferred embodiment of the present invention.

FIG. 26 is a schematic plan view of an acoustic wave device of Modification 7 of a preferred embodiment of the present invention. As shown in FIG. 26, an acoustic wave device 100H is different from the acoustic wave device 100F in that the support member 101 is provided with extended passages 160 to 162 to establish communication between the hollow portions 130.

The extended passages 160 to 162 are provided at positions not overlapping the hollow portions 130 in plan view in the first direction D11. For example, the extended passages 160 to 162 are holes provided to the support member 101.

The extended passages 160 to 162 include a first extended passage 160, a second extended passage 161, and third extended passages 162.

The first extended passage 160 is provided on one side of the imaginary partition line L3 in plan view in the first direction D11, and communicates with the first hollow portions 130A. The first hollow portions 130A are provided at positions overlapping the first resonators 120A in plan view in the first direction D11.

The second extended passage 161 is provided on other side of the imaginary partition line L3 in plan view in the first direction D11, and communicates with the second hollow portions 130B. The second hollow portions 130B are provided at positions overlapping the second resonators 120B in plan view in the first direction D11.

The third extended passage 162 is a channel that connects the first hollow portion 130A to the second hollow portion 130B. The third extended passage 162 is provided between the first resonator 120A and the second resonator 120B in plan view in the first direction D11.

Through holes 170 to 173 are provided to the piezoelectric layer 110 at positions overlapping the extended passages 160 to 162 in plan view in the first direction D11. The through holes 170 to 173 communicate with the extended passages 160 to 162. The through holes 170 to 173 can also be used as etching holes to introduce an etchant, for example.

In the acoustic wave device 100H as well, a total number of through holes 112, 115, 116, and 170 to 173 provided to the piezoelectric layer 110 is an even number. Meanwhile, the number of the through holes 112A, 115, 170, and 172 provided on the one side of the imaginary partition line L3 is equal to the number of the through holes 112B, 116, 171, and 173 provided on the other side of the imaginary partition line L3. Accordingly, a variation in deflection per unit area of the piezoelectric layer 110 is therefore reduced, and it is possible to reduce or prevent deterioration of characteristics of the acoustic wave device 100G.

Here, the number of the extended passages in the acoustic wave device 100H is not limited. The support member 101 may be provided with one or more extended passages that establish communication between the hollow portions 130.

Other Preferred Embodiments

The preferred embodiments have been described above as examples of the techniques disclosed in the present specification. However, the techniques in the present disclosure are not limited thereto, but are also applicable to preferred embodiments that undergo modification, replacement, addition, omission, and the like as appropriate. In this context, another preferred embodiment will be described below as an example.

Figure 27:
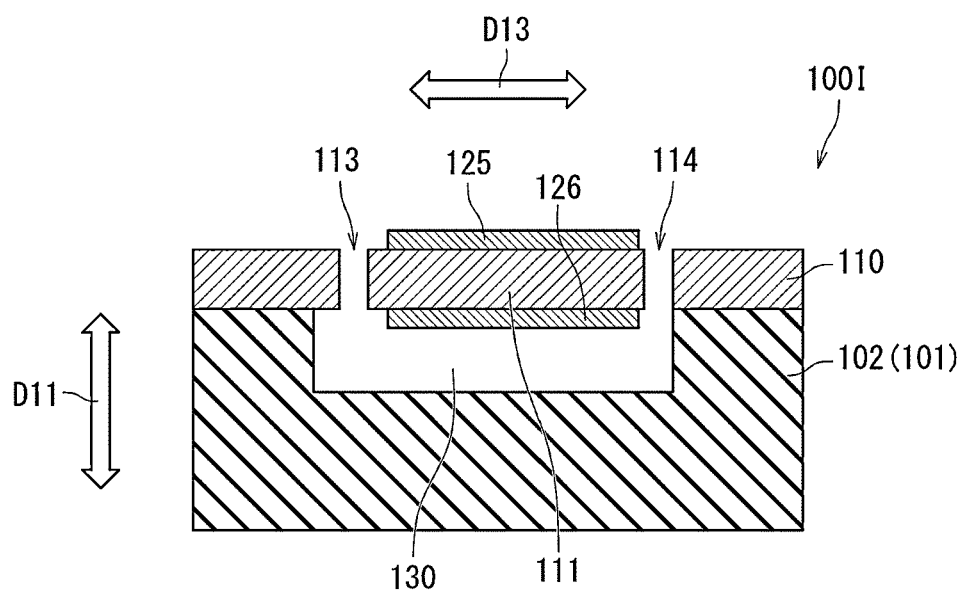
FIG. 27 is a schematic cross-sectional view of an acoustic wave device of another preferred embodiment of the present invention.

FIG. 27 is a schematic cross-sectional view of an acoustic wave device of another preferred embodiment. As shown in FIG. 27, an acoustic wave device 100I may be a bulk wave device including a bulk acoustic wave (BAW) element. To be more precise, in the acoustic wave device 100I, the functional electrodes each include a first electrode 125 and a second electrode 126 opposed to each other with the piezoelectric layer 110 interposed therebetween in the first direction D11. In the present specification, the first electrode 125 may also be referred to as an upper electrode 125, and the second electrode 126 may also be referred to as a lower electrode.

The first electrode 125 and the second electrode 126 are provided to the membrane portion 111. The first electrode 125 is disposed on the piezoelectric layer 110 on the side opposite to the side where the hollow portion 130 is provided. The second electrode 126 is provided on the side of the piezoelectric layer 110 where the hollow portion 130 is formed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support including a support substrate with a thickness direction in a first direction;
   a piezoelectric layer provided on the support; and
   a plurality of resonators each including a functional electrode provided to the piezoelectric layer; wherein
   the support is provided with a hollow portion at a position overlapping at least a portion of each of the plurality of resonators in plan view in the first direction;
   at least a portion of the hollow portion is provided in the support;
   the plurality of resonators include a first resonator and a second resonator adjacent to each other; and
   a through hole reaching the hollow portion is provided to the piezoelectric layer between the first resonator and the second resonator.

2. The acoustic wave device according to claim 1, wherein the first resonator and the second resonator are provided on the piezoelectric layer.

3. The acoustic wave device according to claim 1, wherein the through hole includes a first through hole and a second through hole provided between the first resonator and the second resonator.

4. The acoustic wave device according to claim 3, wherein an opening area of the first through hole is different from an opening area of the second through hole in plan view in the first direction.

5. The acoustic wave device according to claim 3, wherein the first through hole and the second through hole are provided at positions not overlapping each other when viewed in a direction in which the first resonator and the second resonator are adjacent to each other.

6. The acoustic wave device according to claim 3, wherein the first through hole and the second through hole are provided at positions overlapping each other when viewed in a direction in which the first resonator and the second resonator are adjacent to each other.

7. The acoustic wave device according to claim 1, wherein the hollow portion includes a first hollow portion provided at a position overlapping at least a portion of the first resonator in plan view in the first direction and a second hollow portion provided at a position overlapping at least a portion of the second resonator in plan view in the first direction; and
   the first hollow portion and the second hollow portion are partitioned by a portion of the support.

8. The acoustic wave device according to claim 1, wherein the hollow portion is a single hollow portion provided at a position overlapping at least a portion of the first resonator and of the second resonator in plan view in the first direction.

9. The acoustic wave device according to claim 1, wherein a total number of the through holes is an even number.

10. The acoustic wave device according to claim 9, wherein the number of the through holes provided on one side of an imaginary partition line partitioning between the first resonator and the second resonator is equal to the number of the through holes provided on another side of the imaginary partition line.

11. The acoustic wave device according to claim 9, wherein
    the hollow portion includes a plurality of hollow portions provided between the support and the piezoelectric layer at positions overlapping at least portions of the respective resonators in plan view in the first direction;
    the acoustic wave device further includes an extended passage provided to the support and establishing communication between at least two hollow portions out of the plurality of hollow portions;
    the extended passage is provided at a position not overlapping the plurality of hollow portions in plan view in the first direction; and
    the through holes include a through hole that extends through the piezoelectric layer at a position overlapping the extended passage in plan view in the first direction.

12. The acoustic wave device according to claim 11, wherein the extended passage includes a channel that connects a plurality of the hollow portions provided at positions overlapping the plurality of resonators being adjacent to each other in plan view in the first direction.

13. The acoustic wave device according to claim 1, wherein
    the functional electrode includes a first busbar, a second busbar opposed to the first busbar, one or more first electrode fingers provided to the first busbar and extending toward the second busbar, and one or more second electrode fingers provided to the second busbar and extending toward the first busbar;
    the one or more first electrode fingers and the one or more second electrode fingers extend in a second direction intersecting with the first direction, and overlap one another when viewed in a third direction being orthogonal to the second direction; and
    the through hole is located between a first imaginary line passing through a tip end or tip ends of the one or more first electrode fingers and a second imaginary line passing through a tip end or tip ends of the one or more second electrode fingers in plan view in the first direction.

14. The acoustic wave device according to claim 13, wherein
    a third through hole reaching the hollow portion is provided to the first resonator on a side opposite to a side being adjacent to the second resonator;
    a fourth through hole reaching the hollow portion is provided to the second resonator on a side opposite to a side being adjacent to the first resonator; and
    the third through hole and the fourth through hole are provided between the first imaginary line and the second imaginary line in plan view in the first direction.

15. The acoustic wave device according to claim 13, wherein a thickness of the piezoelectric layer is less than or equal to 2p in a case where p is a center-to-center distance between a first electrode finger and a second electrode finger being adjacent to each other out of the one or more first electrode fingers and the one or more second electrode fingers.

16. The acoustic wave device according to claim 1, wherein the acoustic wave device is configured to be capable of using a bulk wave in a thickness-shear mode.

17. The acoustic wave device according to claim 13, wherein d/p is less than or equal to about 0.5 in a case where d is a film thickness of the piezoelectric layer and p is a center-to-center distance between electrode fingers being adjacent to each other out of the one or more first electrode fingers and the one or more second electrode fingers.

18. The acoustic wave device according to claim 17, wherein d/p is less than or equal to about 0.24.

19. The acoustic wave device according to claim 1, wherein the functional electrodes each include one or more first electrode fingers extending in a second direction intersecting with the first direction and one or more second electrode fingers extending in the second direction and opposed to any of the one or more first electrode fingers in a third direction being orthogonal to the second direction, and MR≤about 1.75(d/p)+0.075 is satisfied when a region where the one or more first electrode fingers and the adjacent one or more second electrode fingers overlap each other when viewed in a direction in which the electrode fingers are opposed to each other is an excitation region, and MR is a metallization ratio of the one or more first electrode fingers and the one or more second electrode fingers relative to the excitation region.

20. The acoustic wave device according to claim 1, wherein the acoustic wave device is structured to generate a plate wave.

21. The acoustic wave device according to claim 1, wherein
    the support includes an intermediate layer provided on the support substrate; and
    the hollow portion is provided to the intermediate layer.

22. The acoustic wave device according to claim 1, wherein the hollow portion is provided to the support substrate.

23. The acoustic wave device according to claim 1, wherein the functional electrodes each include a first electrode and a second electrode opposed to each other with the piezoelectric layer interposed therebetween in the first direction.

24. The acoustic wave device according to claim 1, wherein the piezoelectric layer is made of lithium niobate or lithium tantalate.

25. The acoustic wave device according to claim 24, wherein Euler angles (ϕ, θ, ψ) of the lithium niobate or the lithium tantalate fall in a range defined by any of expression (1), expression (2), and expression (3):

$$(0°\pm10°, 0° \text{ to } 20°, \text{any } \psi) \qquad \text{expression (1)};$$

$$(0°\pm10°, 20° \text{ to } 80°, 0° \text{ to } 60° (1-(\theta-50)^2/900)^{1/2}) \text{ or}$$
$$(0°\pm10°, 20° \text{ to } 80°, [180°-60° (1-(\theta-50)^2/900)^{1/2}] \text{ to } 180°) \text{expression} \qquad (2); \text{ and}$$

$$(0°\pm10°, [180°-30° (1-(\psi-90)^2/8100)^{1/2}] \text{ to } 180°,$$
$$\text{any } @) \qquad \text{expression (3)}.$$

26. An acoustic wave device comprising:
    a support including a support substrate with a thickness direction in a first direction;
    a piezoelectric layer provided on the support; and
    a plurality of resonators each including a functional electrode provided to the piezoelectric layer; wherein
    the support is provided with a hollow portion at a position overlapping at least a portion of each of the plurality of resonators in plan view in the first direction;
    the hollow portion is a single hollow portion provided at a position overlapping at least a portion of the first resonator and of the second resonator in plan view in the first direction;
    the plurality of resonators include a first resonator and a second resonator adjacent to each other; and a through hole reaching the hollow portion is provided to the piezoelectric layer between the first resonator and the second resonator.

27. An acoustic wave device comprising:

a support including a support substrate with a thickness direction in a first direction;

a piezoelectric layer provided on the support; and a plurality of resonators each including a functional electrode provided to the piezoelectric layer; wherein the support is provided with a hollow portion at a position overlapping at least a portion of each of the plurality of resonators in plan view in the first direction;

the plurality of resonators include a first resonator and a second resonator adjacent to each other;

a through hole reaching the hollow portion is provided to the piezoelectric layer between the first resonator and the second resonator;

the functional electrode includes a first busbar, a second busbar opposed to the first busbar, one or more first electrode fingers provided to the first busbar and extending toward the second busbar, and one or more second electrode fingers provided to the second busbar and extending toward the first busbar;

the one or more first electrode fingers and the one or more second electrode fingers extend in a second direction intersecting with the first direction, and overlap one another when viewed in a third direction being orthogonal to the second direction; and the through hole is located between a first imaginary line passing through a tip end or tip ends of the one or more first electrode fingers and a second imaginary line passing through a tip end or tip ends of the one or more second electrode fingers in plan view in the first direction.

* * * * *